United States Patent
Ashtiani et al.

(10) Patent No.: US 8,728,958 B2
(45) Date of Patent: May 20, 2014

(54) GAP FILL INTEGRATION

(75) Inventors: Kaihan Ashtiani, Cupertino, CA (US); Michael Wood, San Jose, CA (US); John Drewery, Santa Clara, CA (US); Naohiro Shoda, Los Gatos, CA (US); Bart van Schravendijk, Sunnyvale, CA (US); Lakshminarayana Nittala, Sunnyvale, CA (US); Nerissa Draeger, Fremont, CA (US)

(73) Assignee: Novellus Systems, Inc., Fremont, CA (US)

( * ) Notice: Subject to any disclaimer, the term of this patent is extended or adjusted under 35 U.S.C. 154(b) by 274 days.

(21) Appl. No.: 12/964,110

(22) Filed: Dec. 9, 2010

(65) Prior Publication Data

US 2011/0151678 A1    Jun. 23, 2011

Related U.S. Application Data

(60) Provisional application No. 61/285,091, filed on Dec. 9, 2009.

(51) Int. Cl.
*H01L 21/31* (2006.01)
*H01L 21/469* (2006.01)

(52) U.S. Cl.
USPC ............... 438/786; 438/424; 257/E21.546

(58) Field of Classification Search
None
See application file for complete search history.

(56) References Cited

U.S. PATENT DOCUMENTS

| | | |
|---|---|---|
| 4,099,990 A | 7/1978 | Brown et al. |
| 4,740,480 A | 4/1988 | Ooka |
| 5,320,983 A | 6/1994 | Ouellet |
| 5,387,546 A | 2/1995 | Maeda et al. |
| 5,516,721 A | 5/1996 | Galli et al. |
| 5,534,731 A | 7/1996 | Cheung |
| 5,840,631 A | 11/1998 | Kubo et al. |
| 5,858,880 A | 1/1999 | Dobson et al. |
| 5,874,367 A | 2/1999 | Dobson |
| 5,899,751 A | 5/1999 | Chang et al. |
| 5,902,127 A | 5/1999 | Park |
| 5,932,289 A | 8/1999 | Dobson et al. |
| 6,013,581 A | 1/2000 | Wu et al. |

(Continued)

FOREIGN PATENT DOCUMENTS

| | | |
|---|---|---|
| CN | 1722403 A | 1/2006 |
| WO | WO2011072143 | 6/2011 |

OTHER PUBLICATIONS

U.S. Office Action for U.S. Appl. No. 12/625,468 mailed Apr. 26, 2011.

(Continued)

*Primary Examiner* — Daniel Whalen
*Assistant Examiner* — Shaka White
(74) *Attorney, Agent, or Firm* — Weaver Austin Villeneuve & Sampson LLP

(57) ABSTRACT

Novel gap fill schemes involving depositing both flowable oxide films and high density plasma chemical vapor deposition oxide (HDP oxide) films are provided. According to various embodiments, the flowable oxide films may be used as a sacrificial layer and/or as a material for bottom up gap fill. In certain embodiments, the top surface of the filled gap is an HDP oxide film. The resulting filled gap may be filled only with HDP oxide film or a combination of HDP oxide and flowable oxide films. The methods provide improved top hat reduction and avoid clipping of the structures defining the gaps.

23 Claims, 26 Drawing Sheets

(56) References Cited

U.S. PATENT DOCUMENTS

| | | | |
|---|---|---|---|
| 6,060,384 | A | 5/2000 | Chen et al. |
| 6,114,259 | A | 9/2000 | Sukharev et al. |
| 6,143,626 | A | 11/2000 | Yabu et al. |
| 6,207,535 | B1* | 3/2001 | Lee et al. ............... 438/435 |
| 6,218,268 | B1 | 4/2001 | Xia et al. |
| 6,242,366 | B1 | 6/2001 | Beekman et al. |
| 6,287,989 | B1 | 9/2001 | Dobson |
| 6,300,219 | B1 | 10/2001 | Doan et al. |
| 6,309,933 | B1 | 10/2001 | Li et al. |
| 6,383,951 | B1 | 5/2002 | Li |
| 6,399,213 | B2 | 6/2002 | Shiokawa |
| 6,413,583 | B1 | 7/2002 | Moghadam et al. |
| 6,475,564 | B1 | 11/2002 | Carter et al. |
| 6,544,858 | B1 | 4/2003 | Beekman et al. |
| 6,640,840 | B1 | 11/2003 | MacNeil |
| 6,653,247 | B2 | 11/2003 | MacNeil |
| 6,743,436 | B1 | 6/2004 | Lee et al. |
| 6,743,736 | B2 | 6/2004 | Mardian et al. |
| 6,787,463 | B2 | 9/2004 | Mardian et al. |
| 6,790,737 | B2 | 9/2004 | Schneegans et al. |
| 6,828,162 | B1 | 12/2004 | Halliyal et al. |
| 6,846,757 | B2 | 1/2005 | MacNeil |
| 6,902,947 | B2 | 6/2005 | Chinn et al. |
| 6,984,561 | B2 | 1/2006 | Herner et al. |
| 7,033,945 | B2 | 4/2006 | Byun et al. |
| 7,056,560 | B2 | 6/2006 | Yim et al. |
| 7,071,126 | B2 | 7/2006 | Johnston et al. |
| 7,074,690 | B1 | 7/2006 | Gauri et al. |
| 7,153,783 | B2 | 12/2006 | Lu et al. |
| 7,238,604 | B2 | 7/2007 | Kloster et al. |
| 7,521,378 | B2 | 4/2009 | Fucsko et al. |
| 7,524,735 | B1 | 4/2009 | Gauri et al. |
| 7,582,555 | B1 | 9/2009 | Lang et al. |
| 7,585,704 | B2 | 9/2009 | Belyansky et al. |
| 7,622,369 | B1* | 11/2009 | Lee et al. ............... 438/485 |
| 7,629,227 | B1 | 12/2009 | Wang et al. |
| 7,825,044 | B2 | 11/2010 | Mallick et al. |
| 7,888,233 | B1 | 2/2011 | Gauri et al. |
| 7,888,273 | B1 | 2/2011 | Wang et al. |
| 7,915,139 | B1 | 3/2011 | Lang et al. |
| 8,187,951 | B1 | 5/2012 | Wang et al. |
| 8,278,224 | B1 | 10/2012 | Mui et al. |
| 2002/0006729 | A1 | 1/2002 | Geiger et al. |
| 2003/0077887 | A1* | 4/2003 | Jang et al. ............... 438/553 |
| 2003/0146416 | A1 | 8/2003 | Takei et al. |
| 2003/0159655 | A1* | 8/2003 | Lin et al. ............... 118/719 |
| 2003/0194861 | A1 | 10/2003 | Mardian et al. |
| 2003/0210065 | A1* | 11/2003 | Lu et al. ............... 324/761 |
| 2004/0048455 | A1 | 3/2004 | Karasawa et al. |
| 2004/0152342 | A1* | 8/2004 | Li et al. ............... 438/789 |
| 2004/0224496 | A1* | 11/2004 | Cui et al. ............... 438/626 |
| 2005/0112282 | A1 | 5/2005 | Gordon |
| 2005/0136684 | A1 | 6/2005 | Mukai et al. |
| 2005/0181566 | A1* | 8/2005 | Machida et al. ............... 438/301 |
| 2005/0260864 | A1 | 11/2005 | Huang et al. |
| 2006/0014384 | A1 | 1/2006 | Lee et al. |
| 2006/0024912 | A1* | 2/2006 | Lee ............... 438/424 |
| 2006/0216946 | A1 | 9/2006 | Usami et al. |
| 2006/0223290 | A1 | 10/2006 | Belyansky et al. |
| 2006/0269693 | A1 | 11/2006 | Balseanu et al. |
| 2006/0279217 | A1 | 12/2006 | Peuchert et al. |
| 2007/0054505 | A1 | 3/2007 | Antonelli et al. |
| 2007/0281495 | A1 | 12/2007 | Mallick et al. |
| 2007/0298585 | A1 | 12/2007 | Lubominsky et al. |
| 2008/0020591 | A1 | 1/2008 | Balseanu et al. |
| 2008/0081434 | A1* | 4/2008 | Nam et al. ............... 438/432 |
| 2009/0020847 | A1 | 1/2009 | Byun et al. |
| 2009/0053895 | A1 | 2/2009 | Oshima et al. |
| 2009/0104789 | A1 | 4/2009 | Mallick et al. |
| 2009/0104790 | A1 | 4/2009 | Liang |
| 2010/0109155 | A1 | 5/2010 | Liu et al. |
| 2010/0167533 | A1 | 7/2010 | Lim et al. |
| 2011/0151678 | A1 | 6/2011 | Ashtiani et al. |
| 2012/0149213 | A1 | 6/2012 | Nittala et al. |

OTHER PUBLICATIONS

Gauri et al., "Flowable Film Dielectric Gap Fill Process," Novellus Systems, Inc., U.S. Appl. No. 12/984,524, filed Jan. 4, 2011.
International Search Report and Written Opinion mailed Aug. 10, 2011 for Application No. PCT/US2010/059721.
U.S. Office Action for U.S. Appl. No. 12/334,726 mailed Sep. 16, 2011.
U.S. Final Office Action for U.S. Appl. No. 12/625,468 mailed Oct. 14, 2011.
Wang, et al., "Density Gradient-Free Gap Fill," Novellus Systems, Inc., U.S. Appl. No. 12/986,070, filed Jan. 6, 2011.
U.S. Office Action for U.S. Appl. No. 12/986,070 mailed Nov. 25, 2011.
Danek, et al., "Premetal Dielectric Integration Process," Novellus Systems, Inc., U.S. Appl. No. 13/315,123, filed Dec. 8, 2011.
Nittala, et al., "Bottom Up Fill in High Aspect Ratio Trenches," Novellus Systems, Inc., U.S. Appl. No. 13/313,735, filed Dec. 7, 2011.
Notice of Allowance for U.S. Appl. No. 12/625,468 mailed Jan. 31, 2012.
U.S. Final Office Action for U.S. Appl. No. 12/334,726 mailed Mar. 30, 2012.
U.S. Office Action for U.S. Appl. No. 12/984,524 mailed May 18, 2012.
Notice of Allowance for U.S. Appl. No. 12/566,085 mailed May 29, 2012.
Draeger, et al., "Flowable Oxide Film With Tunable Wet Etch Rate," Novellus Systems, Inc., U.S. Appl. No. 13/493,936, filed Jun. 11, 2012.
Notice of Allowance for U.S. Appl. No. 13/031,077 mailed Aug. 6, 2012.
U.S. Final Office Action for U.S. Appl. No. 12/986,070 mailed Jun. 25, 2012.
U.S. Final Office Action for U.S. Appl. No. 12/984,524 mailed Sep. 14, 2012.
Wang et al., "CVD Flowable Gap Fill", Novellus Systems, Inc., U.S. Appl. No. 13/461,287, filed May 1, 2012.
Mui et al., "Flowable Oxide Deposition Using Rapid Delivery of Process Gases," Novellus Systems, Inc., U.S. Appl. No. 13/607,511, filed Sep. 7, 2012.
U.S. Office Action mailed Aug. 23, 2005, from U.S. Appl. No. 10/810,066.
Lang et al., "CVD Flowable Gap Fill," Novellus Systems, Inc., U.S. Appl. No. 11/323,812, filed Dec. 29, 2005, pp. 1-21.
Notice of Allowance and Fee Due mailed Feb. 15, 2006 from U.S. Appl. No. 10/810,066.
Gauri et al., "Flowable Film Dielectric Gap Fill Process," Novellus Systems, Inc., U.S. Appl. No. 11/447,594, filed Jun. 5, 2006.
U.S. Office Action mailed Jun. 27, 2008, from U.S. Appl. No. 11/447,594.
U.S. Office Action mailed Oct. 26, 2007, from U.S. Appl. No. 11/323,812.
U.S. Office Action mailed Apr. 9, 2008, from U.S. Appl. No. 11/323,812.
U.S. Office Action mailed Oct. 9, 2008, from U.S. Appl. No. 11/323,812.
Wang, et al., "CVD Flowable Gap Fill," Novellus Systems, Inc., U.S. Appl. No. 11/925,514, filed Oct. 26, 2007.
Wang, et al., "Density Gradient-Free Gap Fill," Novellus Systems, Inc., U.S. Appl. No. 11/834,581, filed Aug. 6, 2007.
Notice of Allowance and Fee Due mailed Dec. 11, 2008, from U.S. Appl. No. 11/447,594.
U.S. Office Action mailed Nov. 4, 2008, from U.S. Appl. No. 11/925,514.
U.S. Office Action mailed Nov. 12, 2008, from U.S. Appl. No. 11/834,581.
Antonelli et al., "PECVD Flowable Dielectric Gap Fill," Novellus Systems, Inc., U.S. Appl. No. 12/334,726, filed Dec. 15, 2008.
Gauri et al., "Flowable Film Dielectric Gap Fill Process," Novellus Systems, Inc., U.S. Appl. No. 12/411,243, filed Mar. 25, 2009.
Notice of Allowance and Fee Due mailed Apr. 23, 2009 from U.S. Appl. No. 11/323,812.

(56) References Cited

OTHER PUBLICATIONS

U.S. Final Office Action mailed Jun. 17, 2009, from U.S. Appl. No. 11/925,514.

Notice of Allowance and Fee Due mailed Jul. 29, 2009 from U.S. Appl. No. 11/925,514.

Mui et al., "Flowable Oxide Deposition Using Rapid Delivery of Process Gases," Novellus Systems, Inc., U.S. Appl. No. 12/566,085, filed Sep. 24, 2009.

Lang et al., "CVD Flowable Gap Fill", Novellus Systems, Inc., U.S. Appl. No. 12/508,461, filed Jul. 23, 2009.

Chung, et al., "Flowable Oxide CVD Process for Shallow Trench Isolation in Silicon Semiconductor," Journal of Semiconductor Technology and Science, vol. 4, No. 1, Mar. 2004, pp. 45-51.

U.S. Final Office Action mailed Aug. 6, 2009, from U.S. Appl. No. 11/834,581.

U.S. Office Action mailed Dec. 18, 2009, from U.S. Appl. No. 11/834,581.

Wang et al., "CVD Flowable Gap Fill", Novellus Systems, Inc., U.S. Appl. No. 12/625,468, filed Nov. 24, 2009.

U.S. Office Action mailed Feb. 26, 2010, from U.S. Appl. No. 12/334,726.

U.S. Final Office Action mailed Apr. 22, 2010, for U.S. Appl. No. 11/834,581.

U.S. Office Action mailed May 24, 2010, for U.S. Appl. No. 12/411,243.

U.S. Final Office Action mailed Sep. 13, 2010 for U.S. Appl. No. 12/411,243.

U.S. Final Office Action mailed Oct. 26, 2010 for U.S. Appl. No. 12/334,726.

Notice of Allowance mailed Oct. 6, 2010 for U.S. Appl. No. 12/411,243.

Allowed Claims for U.S. Appl. No. 12/411,243.

Notice of Allowance mailed Nov. 18, 2010 for U.S. Appl. No. 12/508,461.

Allowed Claims for U.S. Appl. No. 12/508,461.

Notice of Allowance mailed Oct. 7, 2010 for U.S. Appl. No. 11/834,581.

Lang et al., "CVD Flowable Gap Fill", Novellus Systems, Inc., U.S. Appl. No. 13/031,077, filed Feb. 18, 2011.

Matsuura, M., et al., "Novel Self-Planarizing CVD Oxide for Interlayer Dielectric Applications," IEEE, 1994, pp. 117-120.

Hatanaka, M., et al., "$H_2O$-TEOS Plasma-CVD Realizing Dielectrics Having a Smooth Surface," IEEE, VMIC Conference, Jun. 11-12, 1991, pp. 435-441.

Sakaue, H., et al., "Digital Chemical Vapor Deposition of $SiO_2$ Using a Repetitive Reaction of Triethylsilane/Hydrogen and Oxidation," Department of Electrical Engineering, Hiroshima University, published Nov. 17, 1990, pp. L 124-L 127.

Nakano, M., et al., "Digital CVD of $SiO_2$," Extended Abstracts of the $21^{st}$ Conference on Solid State Devices and Materials, Tokyo, 1989, pp. 49-52.

Noguchi, S., et al., "Liquid Phase Oxidation Employing O Atoms Produced by Microwave Discharge and $Si(CH_3)_4$," Extended Abstracts of the $19_{th}$ Conference on Solid State Devices and Materials, Tokyo, 1987, pp. 451-454.

Chung, Sung-Woong, et al., "Novel Shallow Trench Isolation Process Using Flowable Oxide CVD for sub-100nm DRAM," IEEE, 2002, IEDM, pp. 233-236.

US Notice of Allowance, dated Mar. 7, 2013, issued in U.S. Appl. No. 12/984,524.

US Office Action, dated Dec. 6, 2012, issued in U.S. Appl. No. 12/964,110.

Chinese First Office Action dated Feb. 28 2014, issued in Application No. 201080055670.3.

\* cited by examiner

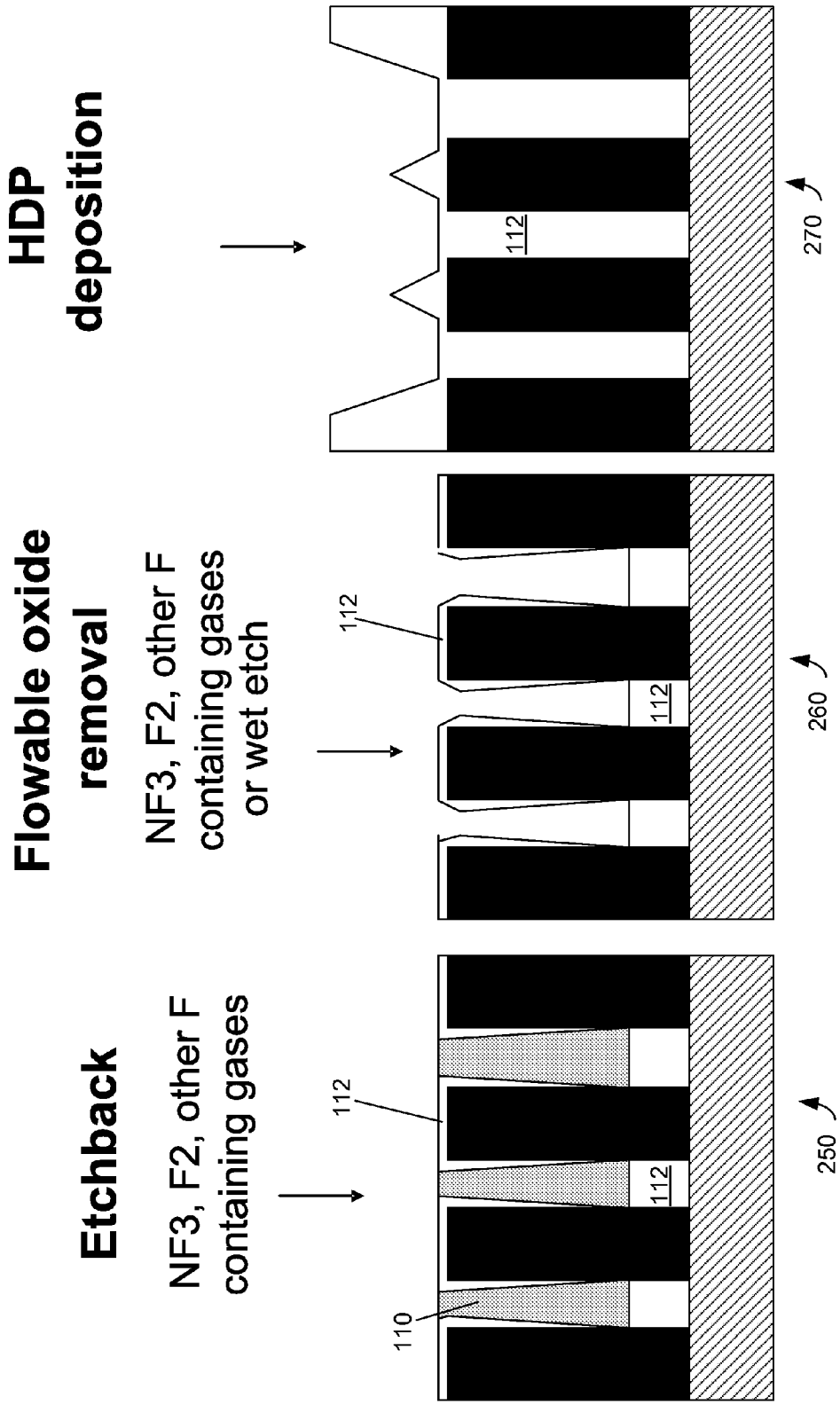
Figure 2B, cont.

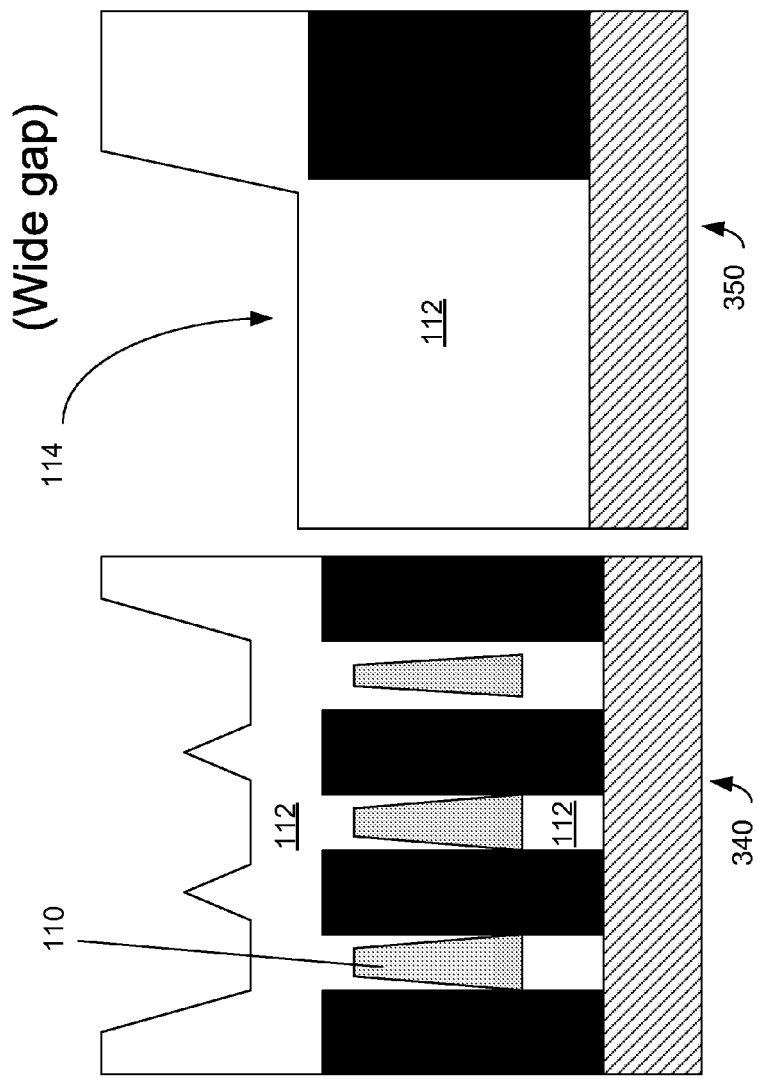
Figure 3B, cont.

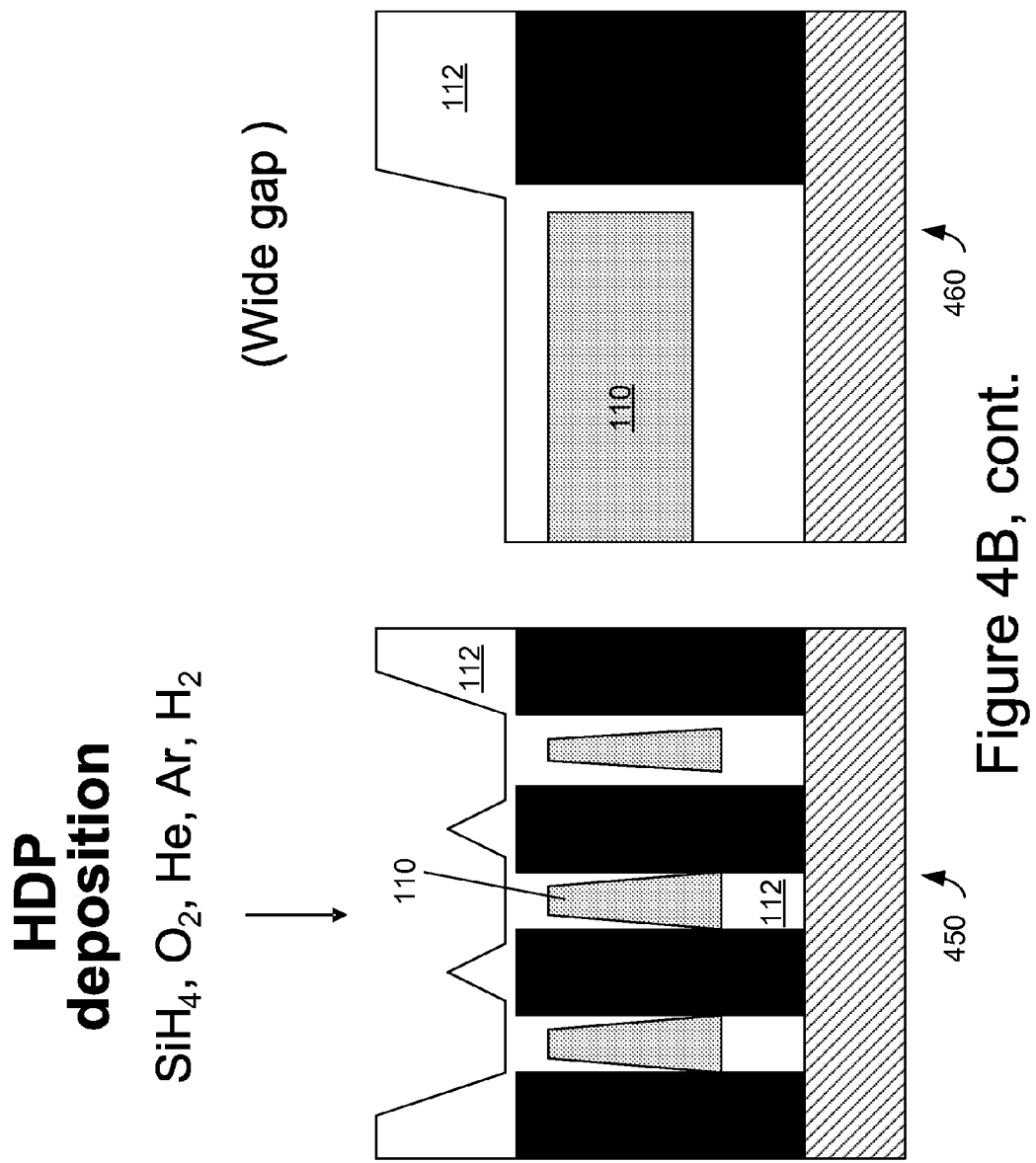
Figure 4B, cont.

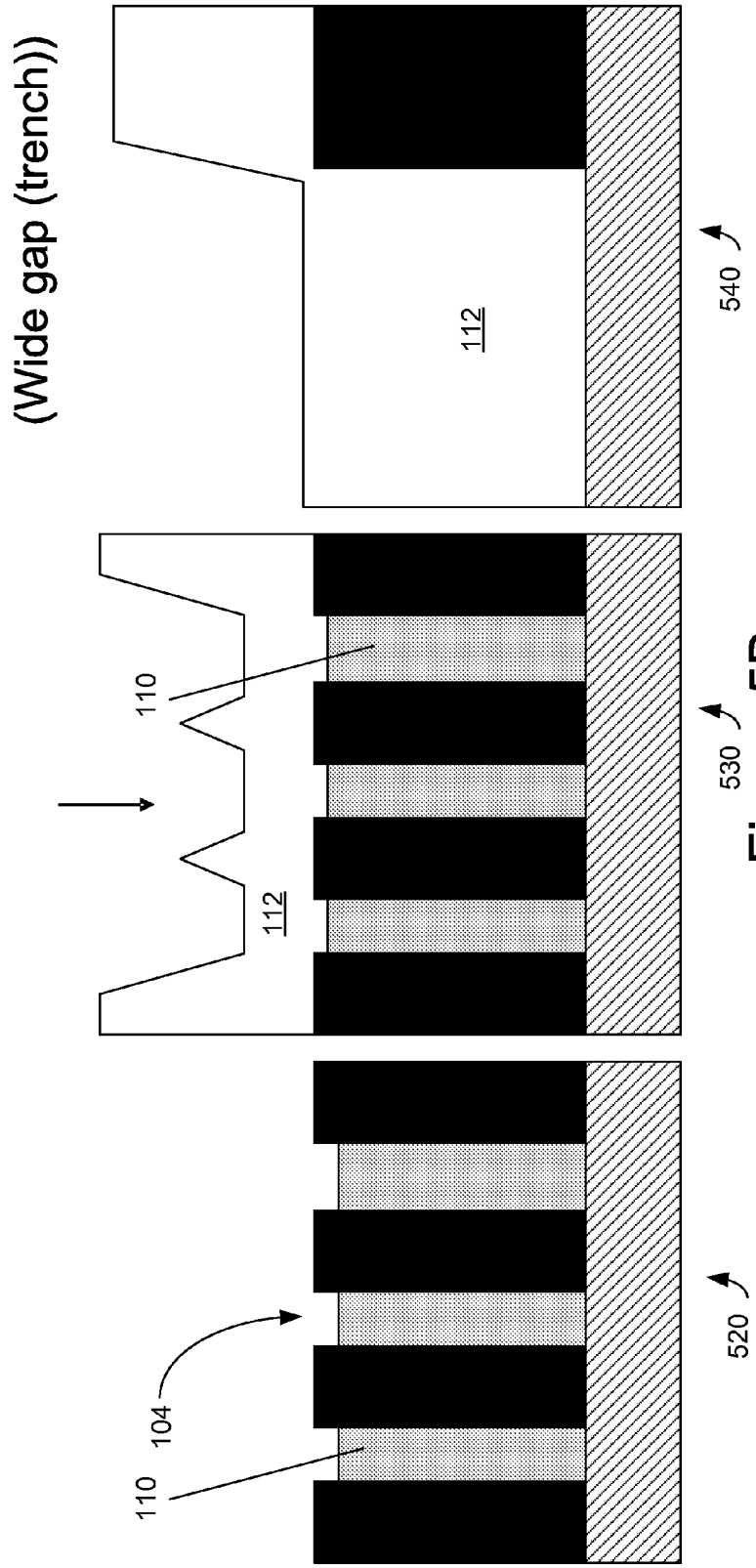

GAP FILL INTEGRATION

CROSS-REFERENCE TO RELATED APPLICATION

This application claims benefit of U.S. Provisional Patent Application No. 61/285,091, filed Dec. 9, 2009, which is incorporated by reference herein.

BACKGROUND OF THE INVENTION

It is often necessary in semiconductor processing to fill high aspect ratio gaps with insulating material. This is the case for shallow trench isolation (STI), inter-metal dielectric (IMD) layers, inter-layer dielectric (ILD) layers, pre-metal dielectric (PMD) layers, passivation layers, etc. As device geometries shrink and thermal budgets are reduced, void-free filling of narrow width, high aspect ratio (AR) features (e.g., AR>6:1) becomes increasingly difficult due to limitations of existing deposition processes.

SUMMARY OF THE INVENTION

Novel gap fill schemes involving depositing both flowable oxide films and high density plasma chemical vapor deposition oxide (HDP oxide) films are provided. According to various embodiments, the flowable oxide films may be used as a sacrificial layer and/or as a material for bottom up gap fill. In certain embodiments, the top surface of the filled gap is an HDP oxide film. The resulting filled gap may be filled only with HDP oxide film or a combination of HDP oxide and flowable oxide films. The methods provide improved top hat reduction and avoid clipping of the structures defining the gaps.

The detailed description below will further discuss the benefits and features of this invention.

BRIEF DESCRIPTION OF THE DRAWINGS

FIG. 5B includes schematic cross-sectional depictions of operations in FIG. 5A.

FIG. 6A also includes a plot of aspect ratio for various sized features before and after flowable deposition.

DETAILED DESCRIPTION OF THE INVENTION

Introduction

Figure 1A:
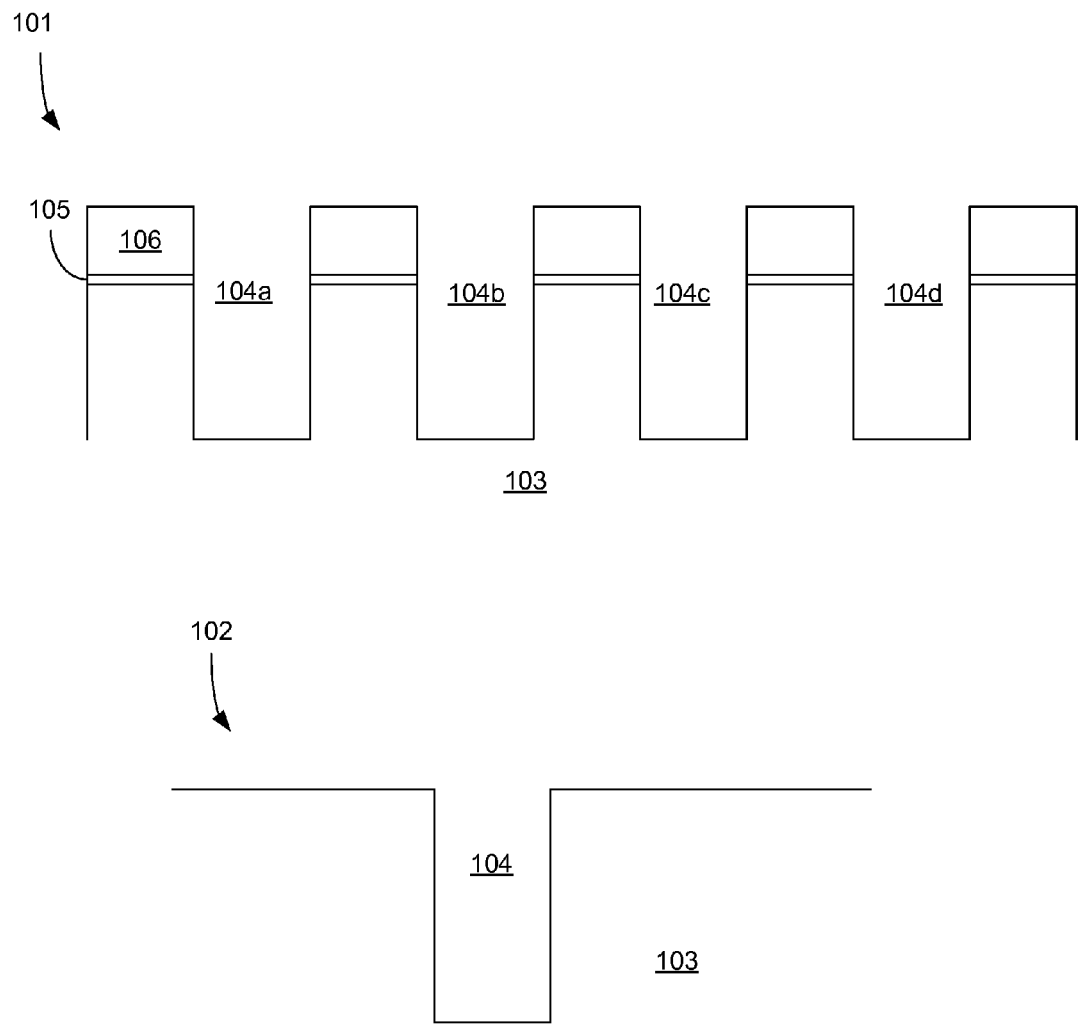
FIG. 1A includes schematic cross-sectional depictions of unfilled gaps in a shallow trench isolation (STI) integration process.

The present invention pertains to methods of filling gaps on a substrate. In certain embodiments, the methods pertain to filling high aspect (AR) ratio (typically at least 6:1, for example 7:1 or higher), narrow width (e.g., sub-50 nm) gaps. In certain embodiments, the methods pertain filling both low AR gaps (e.g., wide trenches). Also in certain embodiments, gaps of varying AR may be on the substrate, with the embodiments directed at filling low and high AR gaps.

According to various embodiments, the methods involve depositing both flowable oxide films and high density plasma chemical vapor deposition oxide (HDP oxide) films in a gap. According to various embodiments, the flowable oxide films may be used as a sacrificial layer and/or as a material for bottom up gap fill. In certain embodiments, the top surface of the filled gap is an HDP oxide film. The resulting filled gap may be filled only with HDP oxide film or a combination of HDP oxide and flowable oxide films. The methods provide improved top hat reduction and avoid clipping of the structures defining the gaps.

As used herein, the term "HDP oxide film" refers to doped or undoped silicon oxide films deposited using high density plasma chemical vapor deposition processes. Generally, a high density plasma is any plasma having electron density of at least about $5 \times 10^{10}$ electrons per cubic centimeter, and more typical $1 \times 10^{11}$ electrons per cubic centimeter. HDP CVD reactions may also be characterized in certain embodiments, by relatively low reactor pressures, in the range of 100 mTorr or lower.

While the below description refers chiefly to HDP oxide cap films, other types of dielectric films may be used including TEOS oxide deposited by plasma enhanced chemical vapor deposition (PECVD), sub-atmospheric CVD (SACVD) or dielectric deposited by any other method.

As used herein, the term "flowable oxide film" is a flowable doped or undoped silicon oxide film having flow characteristics that provide consistent fill of a gap. The flowable oxide film may also be described as a soft jelly-like film, a gel having liquid flow characteristics, a liquid film, or a flowable film. Unlike HDP-CVD reactions, forming a flowable film may involve reacting a silicon-containing precursor and an oxidant to form a condensed flowable film on the substrate. Formation of the film may be aided by a catalyst, e.g., as described in U.S. patent application Ser. No. 11/925,514, filed Oct. 26, 2007, incorporated by reference herein. The flowable oxide deposition methods described herein are not limited to a particular reaction mechanism, e.g., the reaction mechanism may involve an adsorption reaction, a hydrolysis reaction, a condensation reaction, a polymerization reaction, a vapor-phase reaction producing a vapor-phase product that condenses, condensation of one or more of the reactants prior to reaction, or a combination of these. The substrate is exposed to the process gases for a period sufficient to deposit a flowable film to fill at some of the gaps. The deposition process typically forms soft jelly-like film with good flow characteristics, providing consistent fill. In certain embodiments, the flowable film is an organo-silicon film, e.g., an amorphous organo-silicon film.

As deposited HDP oxide films are densified solids and not flowable, whereas as-deposited flowable oxide films are not fully densified. The term "flowable oxide film" may be used herein to refer to flowable oxide films that have undergone a densification process that wholly or partially densifies the film and/or a conversion process that wholly or partially chemically converts the film as well as as-deposited flowable oxide films. Details of HDP-CVD and flowable oxide deposition processes are described further below.

While the description below refers chiefly to flowable silicon oxide films, the integration schemes described herein may also be used with other types of flowable dielectric films. For example, the film as-deposited may be primarily silicon nitride, with Si—N and N—H bonds, or silicon oxynitride. In certain embodiments, such films may be converted by a cure process to a SiO or SiON network.

In certain embodiments, shallow trench isolation (STI) integration methods are provided. FIG. 1A depicts cross-sectional schematic representations of dense (at 101) and isolated (at 102) gaps to be filled in an STI process. At 101, gaps 104a-104d are trenches formed in a silicon or silicon-on-insulator (SOI) substrate 103. Pad oxide layer 105 and silicon nitride layer 106 are also depicted. The sidewalls of the trench may also be coated with an oxide layer or a liner layer (not shown), for example a SiON or SiN layer. At 102, an isolated gap 104 formed in a silicon or SOI substrate 103 is depicted. Although not shown, the sidewalls of gap 104 may also be defined by oxide, nitride and other layers. While the gaps depicted schematically in FIG. 1A have a generally square profile, the sidewalls of the gap may be slanted, e.g., as depicted schematically in FIG. 6, below.

A gap typically is defined by a bottom surface and sidewalls. The term sidewall or sidewalls may be used interchangeably to refer to the sidewall or sidewalls of a gap of any shape, including a round hole, a long narrow trench, etc. The sidewall and bottom surfaces that define the gap may be one or multiple materials. Examples of gap sidewall and bottom materials include nitrides, oxides, carbides, oxynitrides, oxycarbides, silicides, as well as bare silicon or other semiconductor material. Particular examples include SiN, $SiO_2$, SiC, SiON, NiSi, and any other silicon-containing material. In certain embodiments, prior to flowable dielectric deposition, the gap is provided with a liner, barrier or other type of conformal layer formed in the gap, such that all or a portion of the bottom and/or sidewalls of the gap is the conformal layer.

A gap may also be characterized by the structures it lies between. In certain embodiments, such as in the examples depicted in FIG. 1A, the structures are or include areas of a silicon substrate between gaps etched into the substrate. The structures (also referred to herein as raised features or features) may also be, for example, hardmasks, metal vias or trench lines, transistor gates or other features. Adjacent structures define a gap there-between. The structures may include one or more liner layers that form the sidewalls of the gap.

In gaps that are filled solely with HDP oxide, in addition to fill of HDP oxide at the bottom of the gaps, HDP oxide is deposited on top of the structures (top hats) and overhangs and cusps at the entry region of the gap to be filled. The overhang formations result from sputtering and redeposition processes. The directional aspect of the deposition process produces some high momentum charged species that sputter away material from within the gap. The sputtered material tends to redeposit on the sidewalls of high AR structures. If allowed to grow, the cusps deposited on the sidewalls of the feature can prematurely close-off the gap. To remove these cusps and top hat formations, an etch back process is performed. The etching is accomplished by exposure to a fluorine-containing compound, e.g., a plasma containing fluorine species. These species normally originate from a fluorine-containing process gas component such as $SiF_4$, $SiH_2F_2$, $Si_2F_6$, $C_2F_6$, $NF_3$, $CF_4$, and the like. Other etch processes may also be employed such as a wet etch in HF.

The etch is limited by clipping of the structure by the etchants, typically at top corner of structure or sidewall of gap, as shown. Clipping refers to damage due to the exposure of the structure to etchants and may be the result of either physical or chemical etch processes. Clipping causes problems in subsequent process steps, such as lack of CMP polish stop due to SiN erosion, and problems in electrical performance, such as clipping (erosion) into a Si sidewall in trenches. For example, an NF3 etch of an HDP oxide deposited in a high AR gap next to a wide gap (such as a trench) can result in sidewall clipping of the high AR feature by lateral chemical etch by NF3, due to thin sidewall coverage. For advanced structure, the deposition amount per cycle becomes thinner, resulting in a disappearing NF3 etch process window.

Figure 1B:
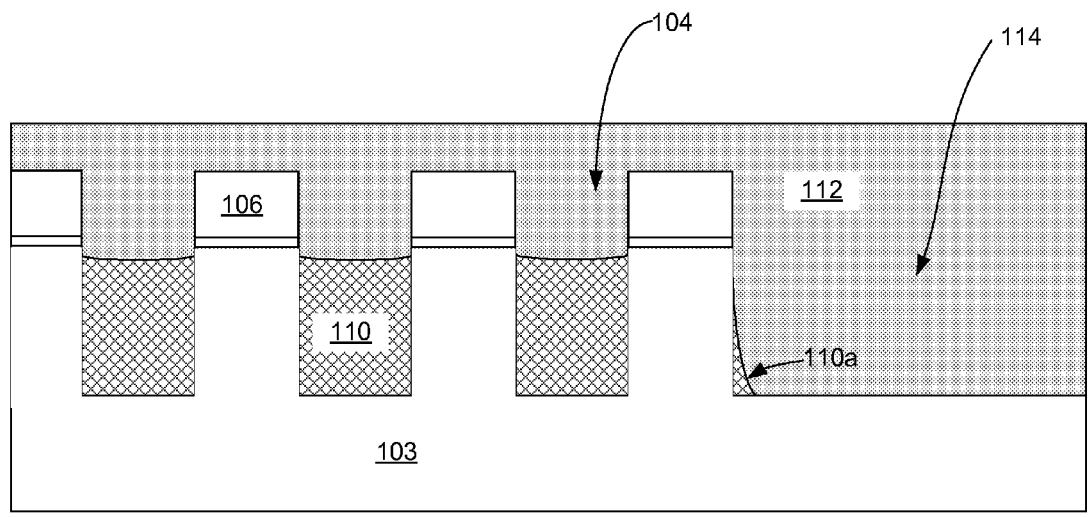
FIGS. 1B and 1C are schematic cross-sectional depiction of gaps filled by a method according to certain embodiments.

FIG. 1B is a representation of gaps 104 filled according to certain embodiments. In the depicted embodiment, each gap 104 is filled with dielectric material, a flowable dielectric material 110 and HDP oxide material 112. According to various embodiments, the flowable dielectric material 110 fills the gap to a level beneath that of silicon nitride layer 106. According to various embodiments, the flowable dielectric material 110 is at least 50 nm from the bottom of the silicon nitride layer 106. A wide trench 114 filled with HDP oxide 112 is also depicted in FIG. 1B. A small amount of flowable dielectric 110a is present on the depicted sidewall of trench 114; as with the flowable dielectric material in narrow gaps 104, it is at least 50 nm or so below the silicon nitride layer of that sidewall.

Figure 1C:
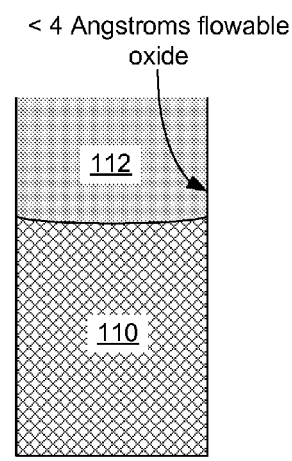

In certain embodiments, there is substantially no flowable oxide deposition on the sidewall in narrow gaps above the level of the flowable oxide deposition; that is to say that there is substantially no conformal component to the bottom up flowable oxide deposition. FIG. 1C depicts a cross-section a gap partially filled with flowable oxide 110, with the remainder of the gap filled with HDP oxide 112. A capillary condensation reaction mechanism used in certain embodiments to deposit the flowable oxide and described further below results in bottom up flow with a concave meniscus, as shown. Above the meniscus, deposition on the sidewall is no more than about 1 monolayer, or less than about 4 Angstroms, per flowable oxide deposition cycle; with total deposition (depending on the number of cycles) on the sidewalls less than twenty Angstroms or less than ten Angstroms for example. This results in substantially all HDP oxide in the gap above the flowable oxide level (e.g., at least 50 nm below a SiN layer). This beneficial as a substantial amount of flowable dielectric sidewall deposition (e.g., 100 Angstroms or more) may result in unwanted etching at the sidewall during later processes in which the HDP oxide is etched.

According to various embodiments, the methods of the invention provide improved gap fill by using a flowable oxide film as a sacrificial film during HDP-CVD gap fill and/or using a flowable oxide film for bottom up gap fill in conjunction with HDP oxide, as shown in FIG. 1B. According to various embodiments, an unfilled gap is provided, with HDP oxide and flowable oxide deposition processes used to deposit HDP oxide and flowable oxide in the gap. According to various embodiments, the HDP oxide may be deposited first, followed by the flowable oxide or vice-versa. In certain embodiments, the final deposition operation is an HDP-CVD operation such that top surface of the filled gap is HDP oxide. One or more etch operations may be performed after various deposition operations to etch back HDP oxide and/or flowable oxide. The etch operations may be non-selective (etching both HDP oxide and flowable oxide material) or selective (etching primarily or solely flowable oxide or HDP oxide while leaving the other substantially un-etched). FIG. 1B provides an example of filled gaps according to one process scheme. Various embodiments are set forth below as examples of process schemes.

Figure 2A:
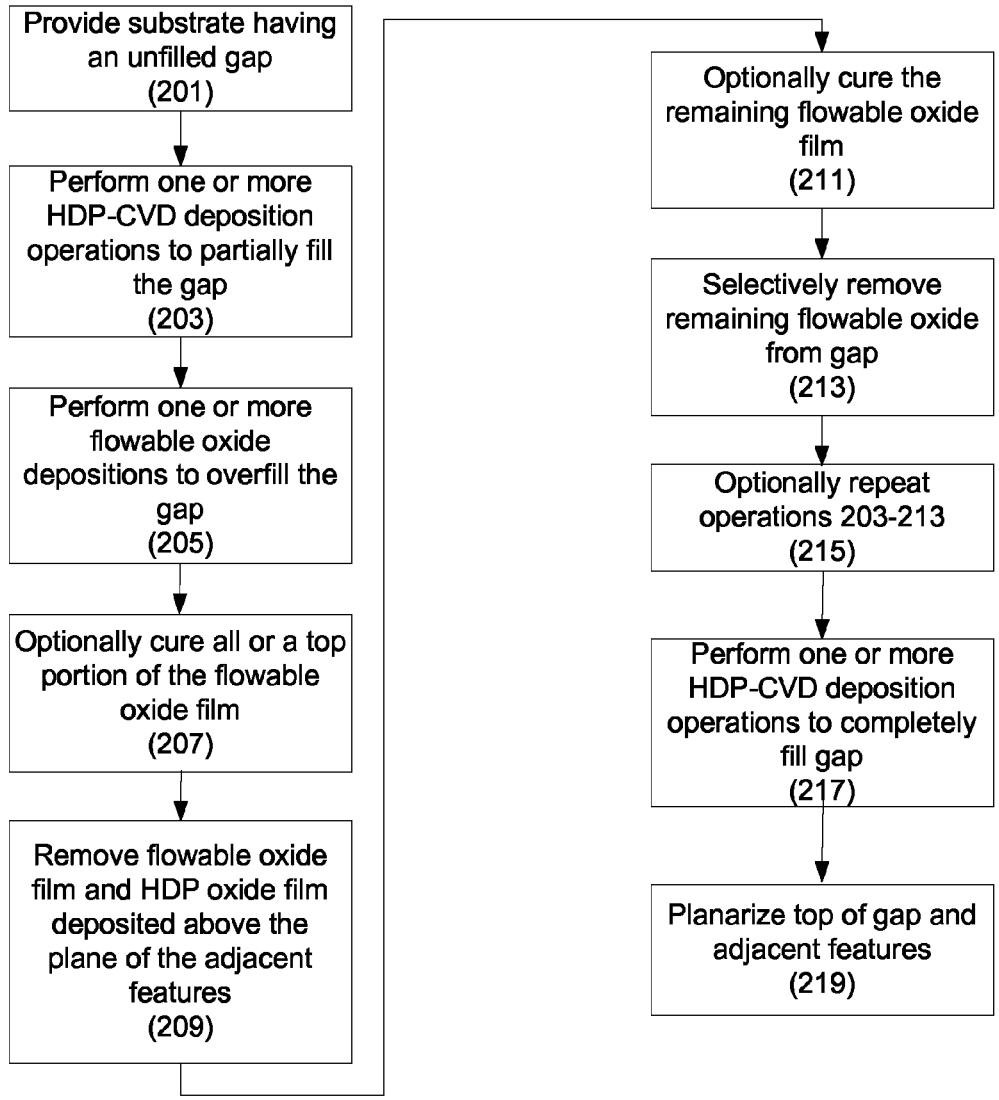
FIG. 2A is a process flow diagram illustrating operations in a method of filling trenches or other gaps with dielectric material according to certain embodiments.
Figure 2B:
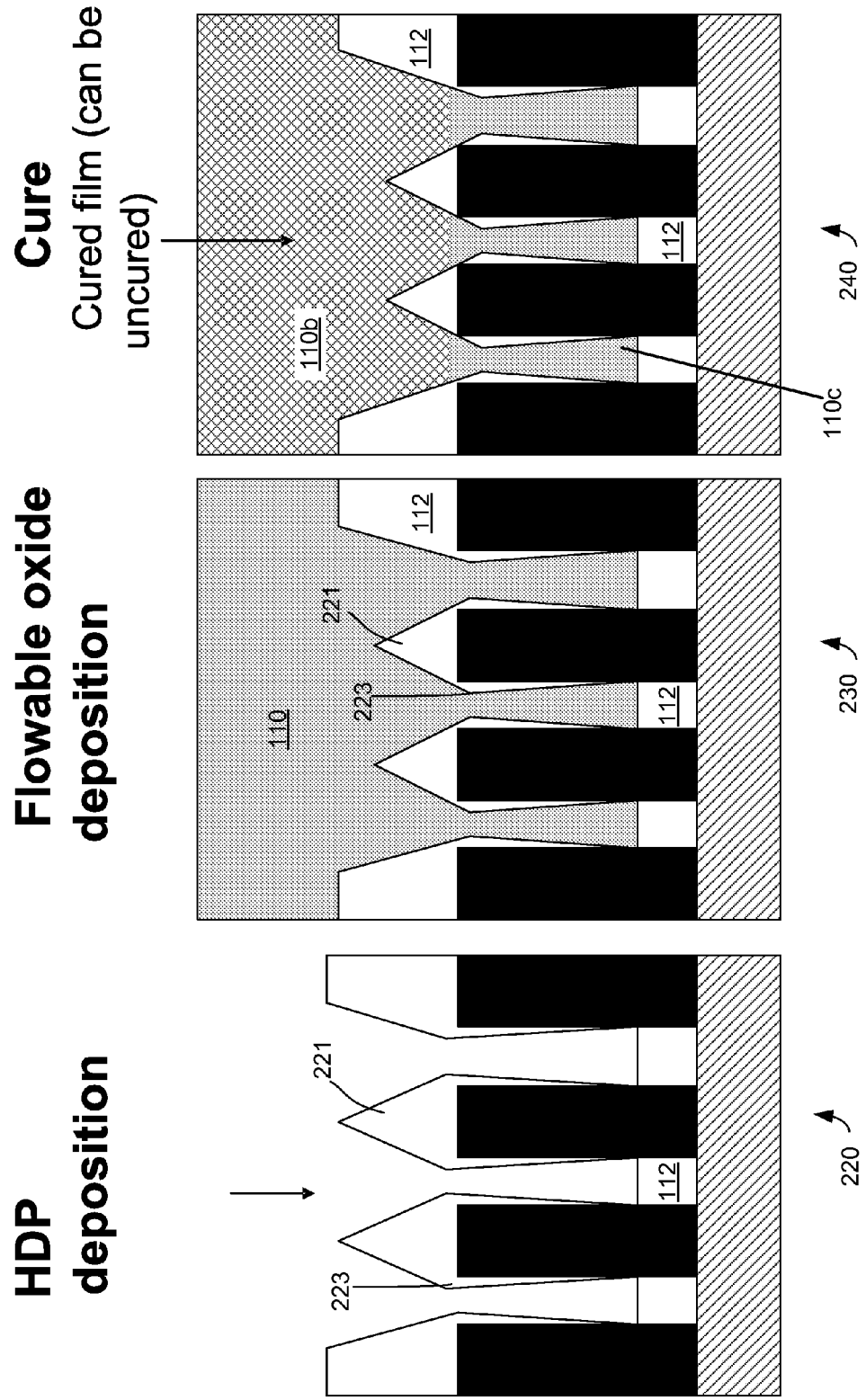
FIG. 2B includes schematic cross-sectional depictions of operations in FIG. 2A.

FIG. 2A is a process flow diagram illustrating an embodiment in which flowable oxide film is used as a sacrificial material to reduce top hat formation while protecting feature sidewalls from the deleterious effects of chemical etchants. The process begins by providing a substrate having raised features and unfilled gaps between the raised features (201). Unfilled generally refers to unfilled with insulation material that is to be deposited to fill the gap; as indicated above, various liner or other layers may be present in the gap. The substrate is provided to an HDP-CVD reactor, additional details of which are described below. One or more HDP-CVD deposition operations may then be performed to partially fill the gap with HDP oxide dielectric material (203). Further details of HDP-CVD deposition processes and parameters are given below. If multiple deposition operations are to be performed, in certain embodiments, they may be interspersed with one or more intervening etch operations and/or an etch operation may be performed after the one or more HDP-CVD deposition operations, e.g. to remove cusp material. In certain embodiments, however, no etch operations are performed prior to the flowable oxide deposition. After HDP-CVD deposition to partially fill the gap, HDP oxide is in the bottom of the gap, on the sidewalls and on top of the raised features (top hats). The sidewall deposition is typically characterized by a narrowing of the gap from a bottom-up perspective, with the most deposition occurring at the entry to the gap. This can be seen in the cross-sectional representations of a partially filled gap after HDP-CVD deposition in FIG. 2B, which depicts features and gaps at various stages of a process as described in this example. At 220, top hats 221 and cusps 223 formed by deposited HDP oxide 112 are depicted. Returning to FIG. 2A, the next operation involves depositing flowable oxide film to overfill the gap (205). That is, enough flowable oxide film is deposited to fill the gap as well as cover the features. In certain embodiments, the HDP oxide top hats are also covered by the flowable oxide film. This is depicted in FIG. 2B as 230, with flowable oxide film 110 filling the gaps and covering HDP oxide top hats 221. Details of the flowable oxide deposition are described further below. According to various embodiments, the flowable oxide deposition may occur in the HDP-CVD deposition chamber or in a separate deposition chamber. In certain embodiments, it may occur in a different station of a multistation chamber. Also in certain embodiments, different process modules are attached on one mainframe. Thus, depending on the embodiment, transitioning between HDP-CVD deposition and flowable oxide deposition may or may not involve transferring the substrate to a different chamber or process module. Note also that if an etch operation is performed between these operations, it may involve transfer to and from a separate etch chamber. Once the flowable oxide is deposited, an optional cure operation may be performed (207). As described below, in the cure process, the film may be densified and/or chemically converted to a desired dielectric composition. In certain embodiments, the densification and conversion are performed in separate operations; or multiple operations may be performed, each densifying and/or curing the film. Still in other embodiments, the as-deposited film may be chemically converted without densification or vice versa. In certain embodiments, cure of the flowable film may be used to tune etch characteristics of the flowable film. In the next operation, a non-selective removal of HDP oxide and flowable oxide is performed; depending on the removal chemistry and process used and the characteristics of the flowable oxide and HDP oxide, performing a cure process may be useful to harmonize the etch rates of these films. As discussed further below, various cure processes may be performed. These processes may densify the film and may completely solidify it in certain cases. In certain embodiments, only a top portion that is to be etched the succeeding operation is cured. In this manner different etch characteristics can be imparted to the top portion of the flowable oxide film, which is to be non-selectively removed, and the bottom portion of the film, which is to be selectively removed. A partially cured film is depicted at 240 in FIG. 2B in which a portion 110*b* of the flowable oxide film 110 that is above the gap is cured. Portion 110*b* may be densified and/or chemically converted to a silicon oxide (or other desired dielectric). In certain embodiments, portion 110*c* remaining in the gap is lower density than portion 110*b*, but is still chemically converted to a SiO network. In other embodiments, portion 110*c* is compositionally different than portion 110*c*. In certain embodiments, no cure operation is performed, with the etch chemistry or conditions suitably to remove the desired film(s). As indicated, a non-selective removal of HDP oxide and flowable oxide is performed (209). The etch stops above the raised features and the gap openings, but removes at least a portion of the top hat deposition, in certain embodiments, most of the top hat deposition. This is depicted at 250 in FIG. 2B, which shows only a thin layer of HDP oxide 112 above the features and the gap opening. The remaining flowable oxide film may then be optionally cured, e.g., to modify its etch characteristics (211). The remaining flowable oxide is then selectively removed, that is it is removed without removing a significant amount of the HDP oxide (213). This is depicted at 260 in FIG. 2B, with only HDP oxide 112 remaining. This may be done using the same or a different removal process as performed in operation 209, for example a wet etch rather than a plasma etch may be used. Operations 203-213 may then be repeated to further partially fill the gap with HDP oxide, overfill the gap with a sacrificial layer of a flowable oxide film, remove HDP oxide and flowable oxide from above the features and gap, and selectively remove the flowable oxide from the gap (215). If these operations are not repeated, or after one or more such repetitions, one or more additional HDP-CVD depositions are performed to complete fill of the gap with HDP oxide (217). In certain embodiments wherein multiple depositions are performed, intervening etch operations may be performed. Alternatively, the gap fill may be completed without additional etch operations. The resulting gap is filled with HDP oxide, with substantially no flowable oxide. In other embodiments, a small amount of flowable oxide film may remain, filling e.g., less than ten percent by volume of the gap. As shown in FIG. 2B at 270, a small amount of top hat HDP oxide deposition may be present, however, because of the previous one or more etch operations 209, the top hats are significantly smaller than they otherwise would be. Moreover, the features are protected during these etch operations. In certain embodiments, the only etch operations performed are those depicted in operations 209 and 213. After completing gap fill, the top of the gap and features may be planarized, e.g., in a chemical-mechanical planarization (CMP) process (219).

Figure 3A:
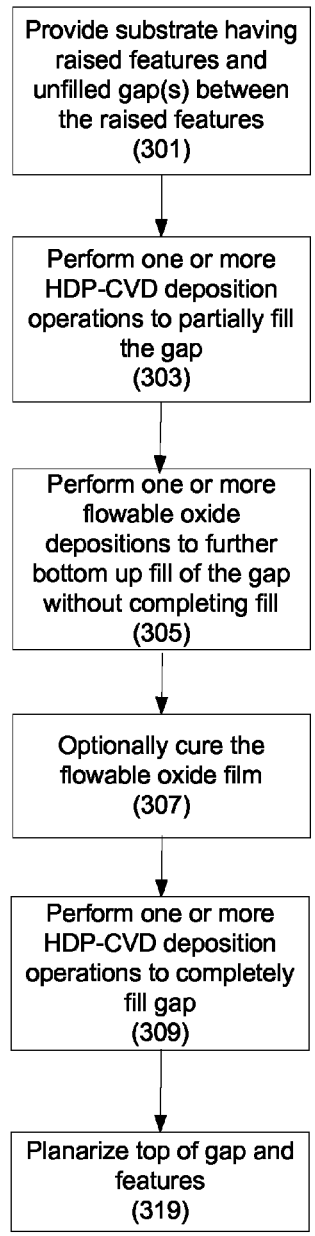
FIG. 3A is a process flow diagram illustrating operations in a method of filling trenches or other gaps with dielectric material according to certain embodiments.
Figure 3B:
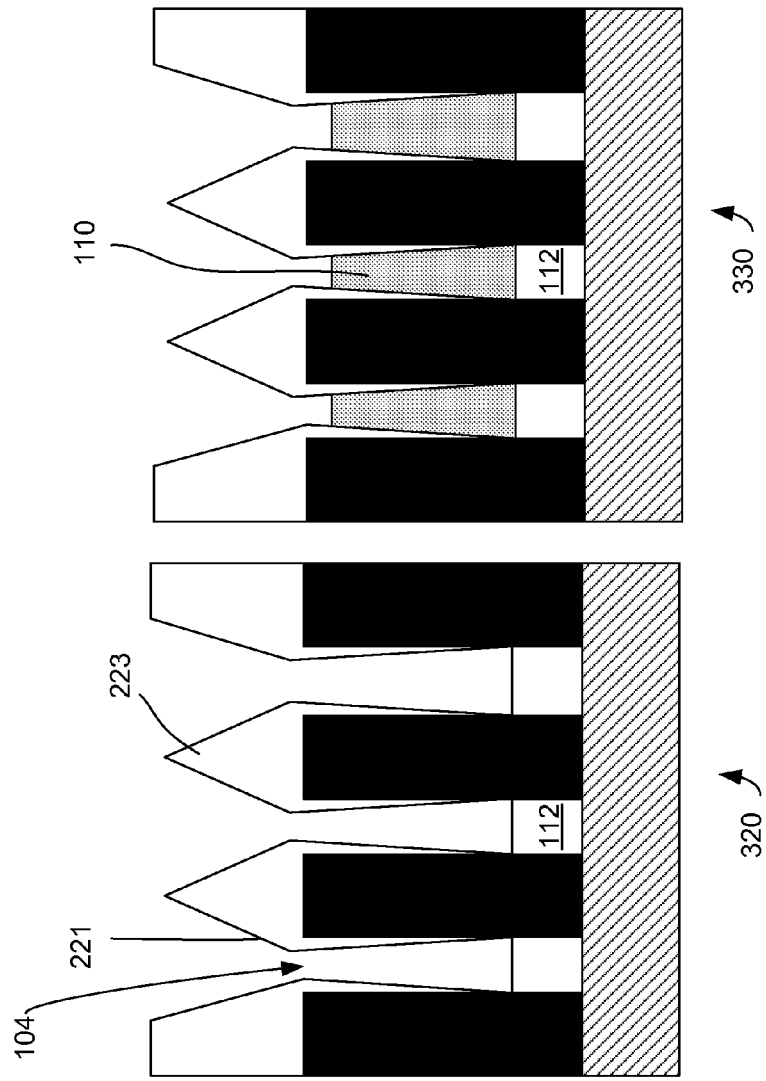
FIG. 3B includes schematic cross-sectional depictions of operations in FIG. 3A.

FIG. 3A is a process flow diagram showing certain operations in a method of gap fill in which flowable oxide increases bottom up fill, with the flowable oxide encapsulated by the HDP oxide, so that the flowable oxide does not touch the sidewalls and bottoms of gaps, and is not exposed on surface. The process begins by providing a substrate having raised features and unfilled gaps between the raised features to an HDP-CVD reactor (301). One or more HDP-CVD deposition operations may then be performed to partially fill the gap with HDP oxide dielectric material (303). As with the process described above with reference to FIG. 2A, if multiple deposition operations are to be performed, in certain embodiments, they may be interspersed with one or more intervening etch operations and/or an etch operation may be performed after the one or more HDP-CVD deposition operations, e.g. to remove cusp material. In certain embodiments, however, no etch operations are performed prior to the flowable oxide deposition. The next operation involves depositing flowable oxide film to further fill the gap (305). After the deposition of flowable oxide film, the gap is still only partially filled in certain embodiments, that is, the flowable oxide is deposited to a point below the top surface of the adjacent features. This is depicted in FIG. 3B, which depicts features and gaps at various stages of a process as described in FIG. 3A. As with all examples described herein, the flowable oxide deposition may occur in the HDP-CVD deposition chamber or in a separate deposition chamber according to various embodiments. The flowable oxide film is then optionally cured (307). As described above and detailed further below, the cure process may convert all or part of the film to a Si—O network. The film may be wholly or partially solidified by a cure process. In certain embodiments, the film is uncured prior to the subsequent HDP oxide deposition. One or more additional HDP-CVD depositions are performed to complete fill of the gap with HDP oxide (309). In certain cases, the HDP-CVD process may densify the flowable oxide film and may wholly or partially solidify it. The resulting gap is filled with HDP oxide and flowable oxide. In certain embodiments, the HDP oxide encapsulates the flowable oxide such that the flowable oxide does not contact the sidewalls and bottoms of gaps, and is not exposed on surface of the filled gap. In alternate embodiments, the HDP oxide partially encapsulates the flowable oxide, for example, contacting the sidewalls of the gap only. After completing gap fill, the top of the gap and features may be planarized, e.g., in a chemical-mechanical planarization (CMP) process (319).

FIG. 3B depicts cross-sectional schematics of deposition in narrow trenches, as well as in a wide trench, as described in FIG. 3A. At 320, narrow gaps 104 are depicted partially filled with HDP oxide 112, including top hat 221 and cusp 223 deposition as well as bottom-up fill. At 330, flowable oxide deposition 110 to a level below the top surface of the adjacent features is depicted. At 340, subsequent HDP deposition 112 is depicted. At 350, FIG. 3B also shows deposition in a wide trench 114. In certain embodiments in which high AR gaps are filled next to such a trench 114 by the method shown in FIG. 3A, the thickness of flowable oxide deposited in the trench during operation 305 is very small and may be negligible. Accordingly, as depicted in FIG. 3B, the trench is substantially filled completely with HDP oxide, with no significant amount of flowable oxide deposited therein.

Figure 4A:
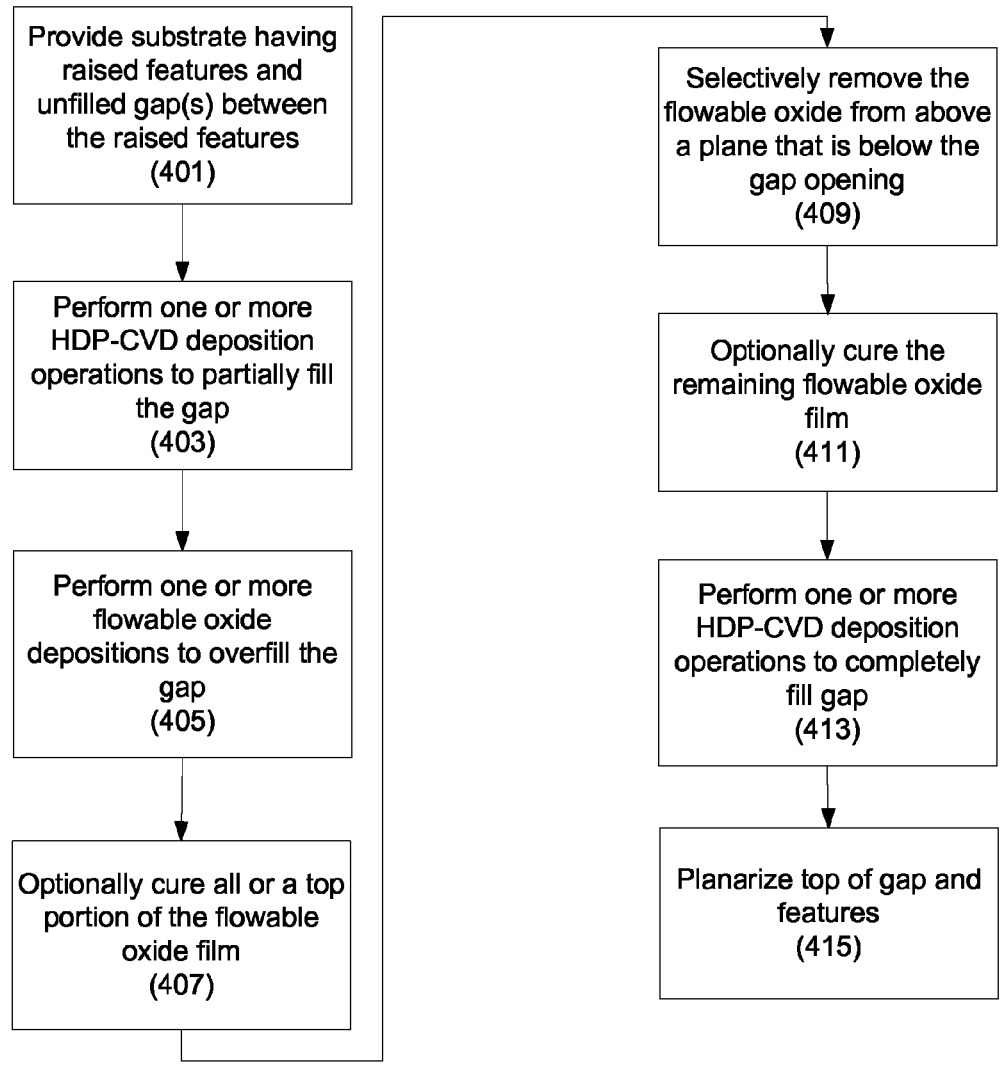
FIG. 4A is a process flow diagram illustrating operations in a method of filling trenches or other gaps with dielectric material according to certain embodiments.

FIG. 4A is a process flow diagram illustrating another embodiment in which flowable oxide film increases bottom up fill. The process begins by providing a substrate having raised features and unfilled gaps between the raised features to a HDP-CVD reactor (401). One or more HDP-CVD deposition operations are then performed to partially fill the gap with HDP oxide dielectric material (403) as in the methods described in FIGS. 2A and 3A. The next operation involves depositing flowable oxide film to overfill the gap (405), also as described above with respect to FIG. 2A. Once the flowable oxide is deposited, an optional cure operation may be performed (407), which may be used to tune etch characteristics of the deposited flowable oxide. In certain embodiments, the flowable oxide film is left uncured to exploit the differences in etch properties of the as-deposited HDP oxide and as-deposited flowable oxide films. A portion of the flowable oxide film is then selectively removed, with the etchback stopping at a point below the gap opening, leaving the gap partially filled with HDP oxide and flowable oxide (409). In certain embodiments, a non-selective etch of the HDP oxide and flowable oxide is performed prior to the selective removal, with the non-selective etchback stopping above the raised features and the gap openings, removing at least a portion of the top hat HDP oxide deposition. After the selective removal, all or part of the remaining flowable oxide film is optionally cured (411). As with the other embodiments, multiple cycles of all or part of the described operations may be performed in certain embodiments. One or more additional HDP-CVD depositions are performed to complete fill of the gap with HDP oxide (413). In certain embodiments wherein multiple depositions are performed, intervening etch operations may be performed. The resulting gap is filled with HDP oxide and flowable oxide. After completing gap fill, the top of the gap and features may be planarized, e.g., in a chemical-mechanical planarization (CMP) process (415).

Figure 4B:
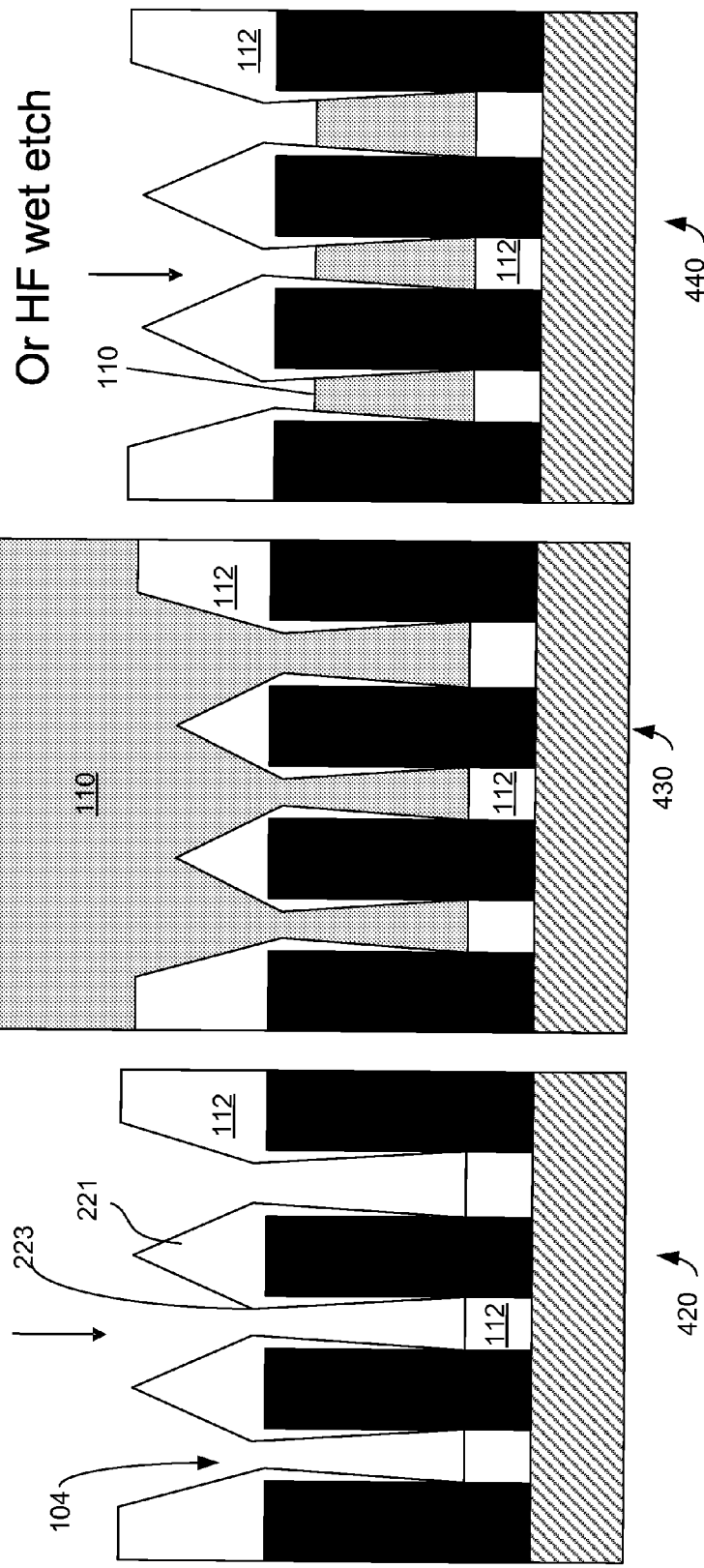
FIG. 4B includes schematic cross-sectional depictions of operations in FIG. 4A.

FIG. 4B which depicts features and gaps at various stages of a process as described in FIG. 4A. At 420, narrow gaps 104 are depicted partially filled with HDP oxide 112, including top hat 221 and cusp 223 deposition as well as bottom-up fill. At 430, flowable material 110 overfills the gaps with the etched back flowable film depicted at 440. Complete fill of the narrow gaps with a combination of HDP oxide 112 flowable oxide 110 is depicted at 450. Deposition in a wide gap is depicted at 460.

In certain embodiments, this process scheme provides a more uniform flowable oxide height across gaps than the process scheme described in FIGS. 3A and 3B. Also, in comparison to that process scheme, the total HDP thickness deposited in this scheme is less in certain embodiments. As a result, the CMP process is easier. As shown in FIG. 4B, the flowable oxide deposition is thicker in smaller gaps and thinner in wider gaps. Note that because at least the high AR gaps are overfilled, the amount of flowable oxide deposited in the wide gaps is greater than that depicted in FIG. 3B. In certain embodiments, the HDP oxide encapsulates the flowable oxide such that the flowable oxide does not contact the sidewalls and bottoms of gaps, and is not exposed on surface of the filled gap. In alternate embodiments, the HDP oxide partially encapsulates the flowable oxide, for example, contacting the sidewalls of the gap only.

Figure 5A:
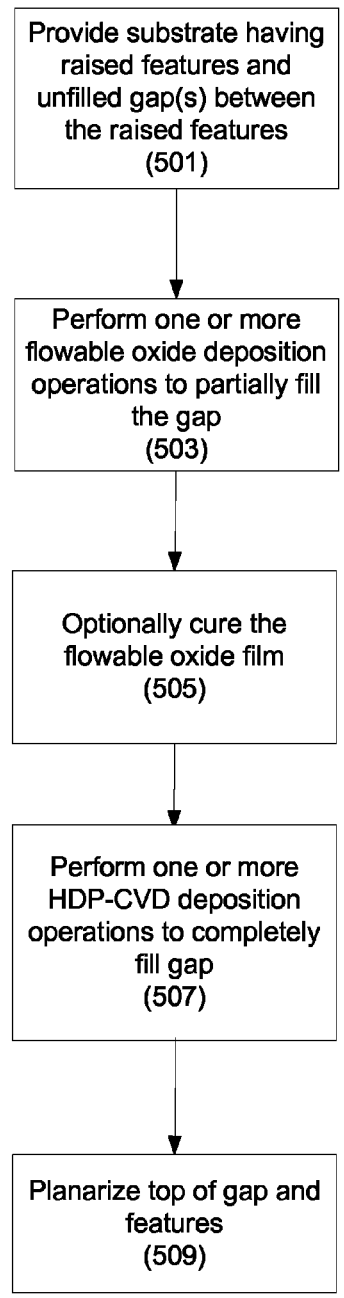
FIG. 5A is a process flow diagram illustrating operations in a method of filling trenches or other gaps with dielectric material according to certain embodiments.

FIG. 5A is a process flow diagram illustrating an embodiment in which flowable oxide film is used for bottom up fill with HDP oxide used as a cap layer to complete fill. The process begins by providing a substrate having raised features and unfilled gaps between the raised features to a reactor (501). Unlike the other examples, HDP oxide is not initially used to partially fill the unfilled gap. Rather, one or more flowable oxide depositions are performed to partially fill the gap with flowable oxide dielectric material (503). If multiple deposition operations are to be performed, in certain embodiments, they may be interspersed with one or more intervening cure operations. As with all examples described herein, the flowable oxide deposition may occur in a HDP-CVD deposition chamber or in a separate deposition chamber according to various embodiments. The flowable oxide film is then optionally cured (505). The film may be wholly or partially solidified by a cure process. In certain embodiments, the film is uncured prior to the subsequent HDP oxide deposition. One or more additional HDP-CVD depositions are performed to complete fill of the gap with HDP oxide (507). In certain cases, the HDP-CVD process may densify the flowable oxide film and may wholly or partially solidify it. The resulting gap is filled with HDP oxide and flowable oxide, with only the HDP oxide exposed at the surface. After completing gap fill, the top of the gap and features may be planarized, e.g., in a chemical-mechanical planarization (CMP) process (509). FIG. 5B depicts features and gaps at various stages of a process as described in this example. At 520, flowable oxide deposition 110 is depicted in gaps 104. At 530, HDP oxide deposition 112 to cap the flowable oxide deposition is depicted. And, at 540, HDP deposition 112 in a wide gap is depicted. As with the process depicted in FIG. 3B, because there is no overfill operation of flowable oxide, the flowable oxide thickness in a wide gap (trench) is much smaller and may be negligible in certain embodiments.

Figure 6A:
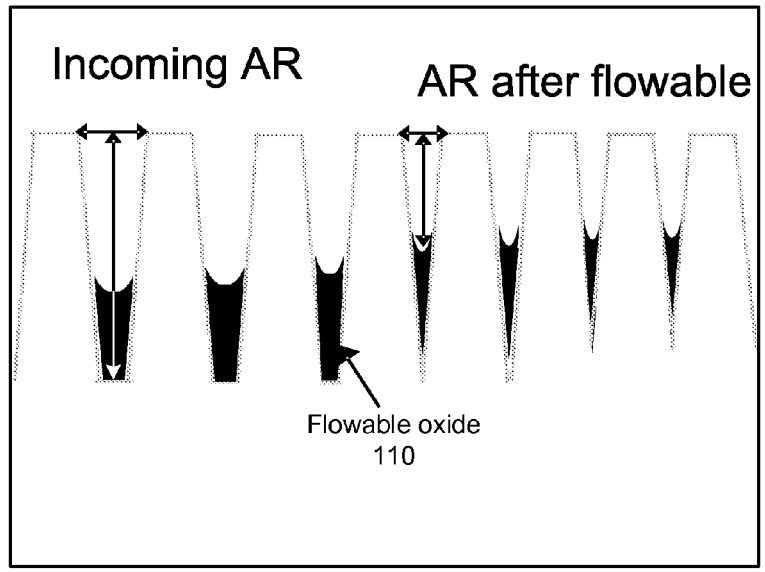
FIG. 6A includes a schematic cross-sectional depiction of incoming aspect ratio (AR) and AR after flowable oxide deposition in features of various sizes.
Figure 6A:
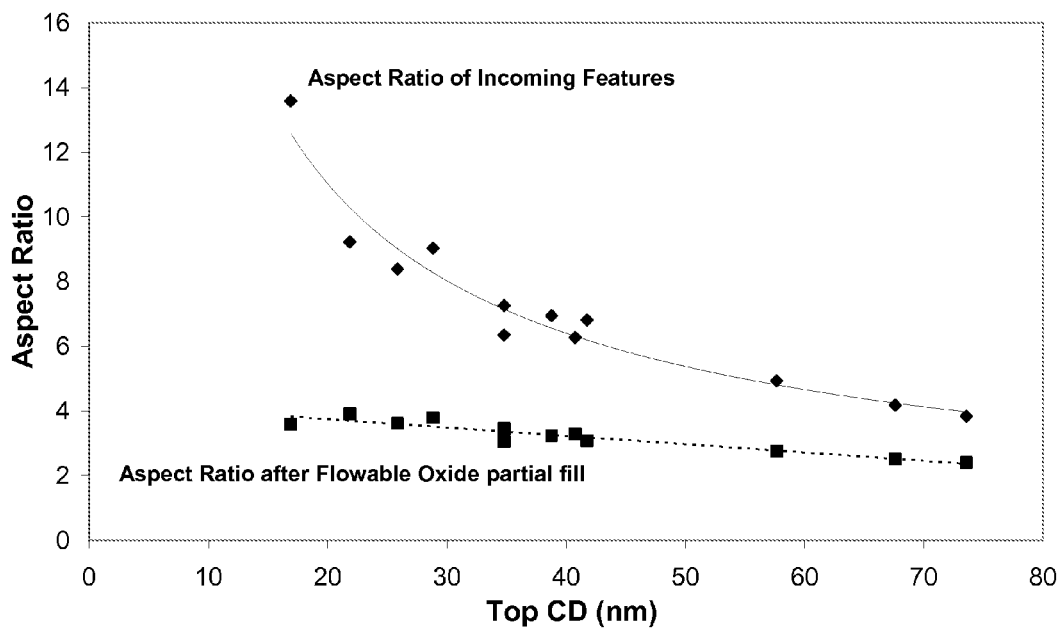
Figure 6B:
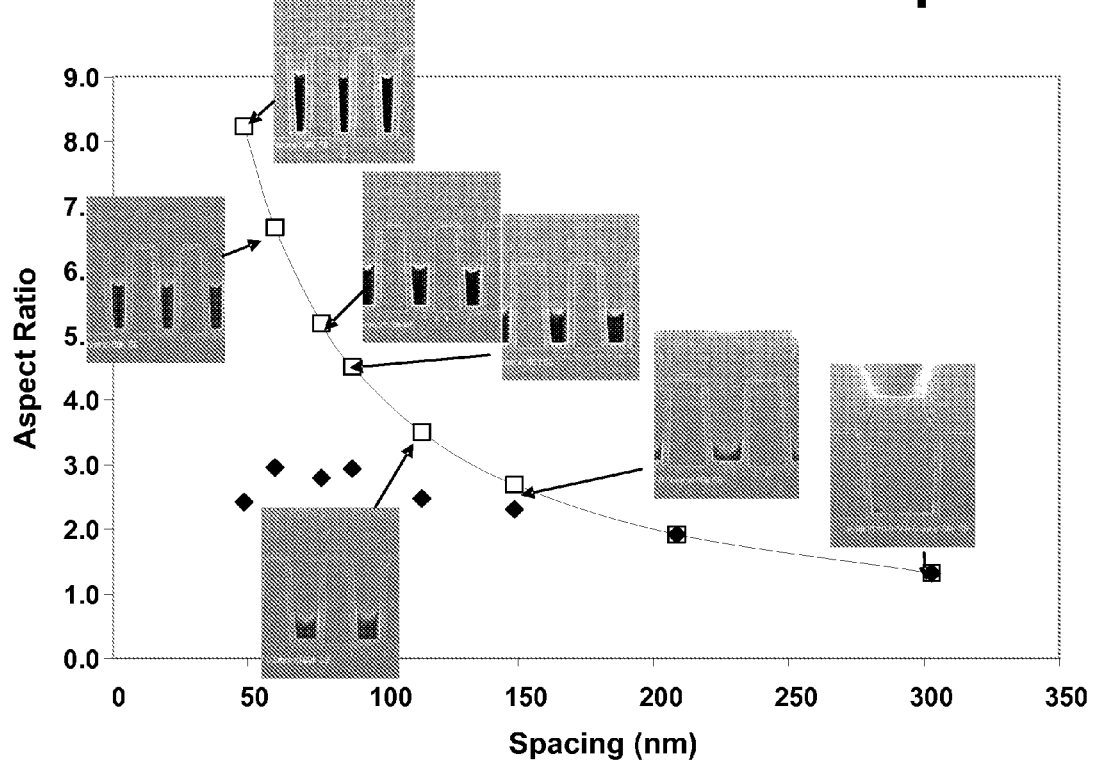
FIG. 6B is another plot of aspect ratio for various sized features before and after flowable deposition. Images of gaps filled with flowable oxide and an HDP oxide cap are shown on the plot.

In certain embodiments, flowable dielectric material is deposited in an incoming unfilled gap to reduce the aspect ratio of the gap for subsequent fill with HDP oxide. FIG. 6A schematically depicts a cross-section of gaps of various aspect ratios partially filled with flowable oxide 110. The aspect ratio is defined as the depth of the trench or other gap divided by the width of its opening. As depicted qualitatively in FIG. 6A, the aspect ratio decreases after bottom-up fill with flowable oxide. Also in FIG. 6A is a plot illustrating aspect ratios prior to and after partial fill by flowable oxide for various critical dimensions. Critical dimension refers to the narrowest dimension of the gap opening. Gap aspect ratios as high as 14:1 were reduced to about 4:1. HDP deposition improves dramatically as aspect ratios are reduced. According to various embodiments, the methods described herein may be used to fill gaps having aspect ratios as high as 60:1, e.g., about 30:1, about 20:1 or about 10:1. Critical dimensions may be as low as 10 nm, 15 nm or 22 nm. In certain embodiments, flowable oxide is deposited to height such that the aspect ratio of the partially filled feature is about 6:1 or lower prior to HDP deposition. FIG. 6B is another plot providing aspect ratios before and after HDP (white square pre-flowable, and black diamonds, post flowable.) In certain embodiments, gaps of different incoming AR are partially filled with a deposition process, with the height of flowable oxide greatest for the narrowest features.

HDP-CVD Processes

As described above, the gap fill methods according to the embodiments described herein include one or more operations in which the gap is partially filled with a dielectric (HDP oxide) deposited by high density plasma (HDP) chemical vapor deposition (CVD) process. Generally, a high density plasma is any plasma having electron density of at least about $5 \times 10^{10}$ electrons per cubic centimeter. Typically, though not necessarily, high density plasma reactors operate at relatively low pressures, in the range of 100 mTorr or lower. The HDP CVD deposition results in beneficial filling of the gap from the bottom up.

Any suitable deposition chemistry may be used. In general, an HDP CVD process gas will include a precursor for the deposition layer. If the dielectric is a silicon-containing dielectric, then the process gas will include a silicon-bearing compound such as silane. The process gas will also generally include a carrier gas. The carrier gas may be an inert gas, such as He and/or other noble gases. Or the carrier gas may be or include elemental or molecular hydrogen. Oxygen to form the silicon oxide or other dielectric material may be provided by the silicon-containing precursor itself or from another process gas such as elemental oxygen ($O_2$), nitric oxide (NO), and/or nitrous oxide ($N_2O$).

The deposition process gas will have a particular composition represented by flow rates of the constituent gases in units of standard cubic centimeter per minute (sccm). The process gas will include a precursor for the deposition layer. If the dielectric is a silicon-containing dielectric, then the process gas will include a silicon-bearing compound such as $SiH_4$, $SiF_4$, $Si_2H_6$, TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof. During deposition, the process decomposes the silicon-containing reactant to form a silicon-containing gas and plasma phase species, which can react on the surface of the substrate.

The process gas will also generally include a carrier gas. The carrier gas may be an inert gas, such as He and/or other noble gases, e.g., Ar. Or the carrier gas may be or include elemental or molecular hydrogen.

Example flow rate ranges for process gases of the present invention are listed below.

| Gas | Flow Rate (sccm) |
| --- | --- |
| $SiH_4$ | 10-300 |
| $O_2$ | 20-1000 |
| He | 0-500 |
| $H_2$ | 0-5000 |
| Ar | 0-500 |

Generally, other oxygen and silicon-containing compounds can be substituted for those listed in this table. Depending upon the atom counts in the precursor gases, the flow rate ranges may have to be changed. While there are no precise rules for modifying flow rates as a function of molecular structure, generally the flow rate of the silicon-containing precursor may be reduced by a factor corresponding to the number of silicon atoms in the molecule. HDP-CVD process gases may contain noble gases (e.g., argon, helium, or xenon) either as the sole carrier gas, or in a mixture with hydrogen.

For doped dielectrics (particularly silicon dioxide based dielectrics), the process gas may include a dopant precursor such as a boron-containing gas, a phosphorus-containing gas, a carbon-containing gas, or a mixture thereof. In a specific embodiment, the gas includes one or more boron-containing reactants and one or more phosphorus-containing reactants and the dielectric film includes a phosphorus- and boron-doped silicon oxide glass (BPSG). Examples of suitable boron and phosphorus precursor gases include the following: $B_2H_6$ and $PH_3$.

If the dielectric is to contain an oxyfluoride (e.g., silicon oxyfluoride), then the process gas preferably includes a fluorine-containing reactant such as silicon hexafluoride ($SiF_4$). If the dielectric is to contain an oxynitride (e.g., silicon oxynitride), then the process gas preferably includes a nitrogen-containing reactant such as $N_2$, $NH_3$, $NF_3$, $NO$, $N_2O$, and mixtures thereof.

The method applies as well to the deposition (biased or unbiased) of carbon-doped silicon oxide from process gas mixtures including organosilanes (e.g., TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof).

Reactor pressure is held at a value necessary to sustain the high-density plasma. In certain embodiments the process vessel is maintained at a pressure of at most about 100 mTorr. In some cases, the process chamber pressure is maintained below 1 mTorr. For many applications, however, the pressure is maintained between about 1 and 100 mTorr; most preferably between about 1 and 30 mTorr.

The temperature within the process vessel should be maintained sufficiently high to ensure that the dielectric deposition reaction proceeds efficiently. Hence, the temperature preferably resides at values between about 30 and 1000° C. This temperature will vary depending upon the types of precursors employed in the reaction. Further, the temperature may be limited by process constraints, such as thermal budget limitations that preclude temperatures above 700-750° C. Such constraints become increasingly common with advanced technologies and corresponding smaller feature sizes. For such applications, the process temperature may be maintained between about 30 and 750° C.

As indicated, to control the substrate temperature, the reactor may supply a heat transfer gas between a surface of the substrate and a surface of the substrate holder on which the substrate is supported during film deposition. The heat transfer gas may include at least one of helium and argon. The back-side helium pressure is set by the temperature requirements of the process (a typical range being between 0-15 Torr).

For some applications, it may be desirable to preheat the wafer to a pre-specified relatively low temperature and then gradually raise the temperature. This allows for isothermal operation. The goal is to start the deposition and then maintain the wafer temperature within a narrow range during the entire deposition process.

The low frequency power applied to the upper electrode (for generating the plasma) typically varies from 1 kW to 20 kW, and the high frequency power (for biasing the wafer) typically reaches at least about 0.2 W/cm² (preferably varying from about 0.5 kW to 10 kW) depending on the substrate size (e.g., 200 or 300 mm diameter) and the requirements of the specific process being used.

As indicated above, the bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The frequency range applied to the upper, plasma-generating electrode is typically between about 300 kHz and 27 MHz.

The deposition conditions may be selected to optimize deposition topography. The deposition topography can be optimized by manipulating the S/D ratio of the deposition process. S/D ratio refers to the sputter/deposition ratio. It is obtained by measuring the deposition rate for a given dielectric deposition process and then measuring the sputter rate for that same process performed without the silicon-containing precursor (e.g., silane). The S/D ratio is given by the following expression:

$$S/D = \text{sputter rate}/(\text{sputter rate} + \text{deposition rate}).$$

The conditions may be set so that the isotropic etch is selective for the HDP CVD deposited dielectric (e.g., $SiO_2$) relative to the feature material, e.g., a silicon nitride barrier layer lining the gap.

An HDP deposition operation may include only a single deposition, or a single deposition-etch operation, or may include a multiple deposition-etch cycles. For example, multiple $SiH_4/O_2$ deposition operations may include intervening $NF_3$ plasma etch operations.

While the above provides a description of example HDP-CVD processes and conditions, the methods described herein are not limited to these particular HDP-CVD processes but may be applied with other HDP-CVD processes.

Flowable Oxide Deposition Processes

As described above, the gap fill methods according to the embodiments described herein include one or more operations in which the gap is partially filled or overfilled with a dielectric flowable oxide film. In many embodiments, the flowable dielectric film is a flowable silicon and oxygen-containing film, though the integration schemes described herein can also be implemented with other flowable dielectric films. According to various embodiments, the flowable film is formed by a spin-on glass technique. In alternate embodiments, the flowable film is formed by introducing vapor phase reactants to a deposition chamber at conditions such that a flowable film is formed on the substrate to fill the gap.

After the substrate is provided to the reaction chamber, process gases are introduced. For forming silicon oxides, the process gas reactants generally include a silicon-containing compound and an oxidant, and may also include a catalyst, a solvent and other additives. The gases may also include one or more dopant precursors, e.g., a fluorine, phosphorous and/or boron-containing gas. Sometimes, though not necessarily, an inert carrier gas is present. In certain embodiments, the gases are introduced using a liquid injection system. In certain embodiments, the silicon-containing compound and the oxidant are introduced via separate inlets or are combined just prior to introduction into the reactor in a mixing bowl and/or showerhead. The catalyst and/or optional dopant may be incorporated into one of the reactants, pre-mixed with one of the reactants or introduced as a separate reactant. The substrate is then exposed to the process gases at an operation. Conditions in the reactor are such that the silicon-containing compound and the oxidant react to form a condensed flowable film on the substrate. Formation of the film may be aided by presence of a catalyst. The method is not limited to a particular reaction mechanism, e.g., the reaction mechanism may involve a condensation reaction, a vapor-phase reaction producing a vapor-phase product that condenses, condensation of one or more of the reactants prior to reaction, or a combination of these. The substrate is exposed to the process gases for a period sufficient to deposit a flowable film to fill at least some of the gap or overfill the gap as desired.

In certain embodiments, the overall deposition process may be described in context of two steps: hydrolysis and condensation. The first step involves hydrolysis of silicon-containing precursors by the oxidant. For example, alkoxy groups (—OR) of the silicon containing precursor may be replaced with hydroxyl groups (—OH). In the condensation step, Si—O—Si linkages may be formed when —OH groups are removed from Si. It should be noted that while these reaction steps provide a useful framework for describing various aspects of the invention, the methods described herein are not necessarily limited to a particular reaction mechanism.

Figure 7:
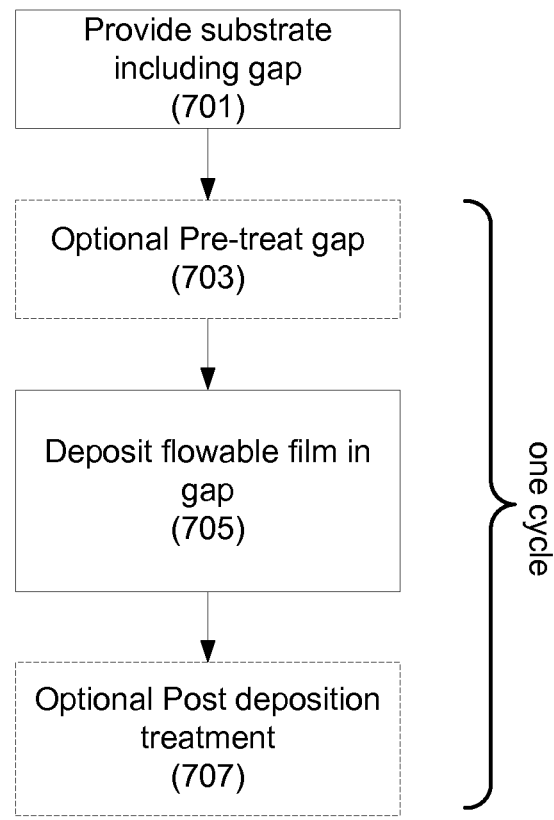
FIG. 7 is a process flow diagram illustrating operations in a method of depositing flowable dielectric material in gaps according to certain embodiments.

FIG. 7 provides certain operations in a method of filling a gap with a flowable oxide material according to certain embodiments. The process typically begins prior to any oxide material being deposited in the gap, with the gap defined by sidewall and bottom surfaces. The sidewall and bottom surfaces may be silicon nitride, silicon oxide, silicon oxynitride, or other silicon-containing materials.

At 701, a substrate including a gap is provided. Then an optional pretreatment operation is performed (Block 703). According to various embodiments, a pretreatment operation involves exposure to a plasma containing oxygen, nitrogen, helium or some combination of these. The plasma may be downstream or in-situ, generated by a remote plasma generator, such as an Astron® remote plasma source, an inductively-coupled plasma generator or a capacitively-coupled plasma generator. Examples of pre-treatment gases include $O_2$, $O_3$, $H_2O$, NO, $NO_2$, $N_2O$, $H_2$, $N_2$, He, Ar, and combinations thereof, either alone or in combination with other compounds. Examples of chemistries include $O_2$, $O_2/N_2$, $O_2/He$, $O_2/Ar$, $O_2/H_2$. The particular process conditions may vary depending on the implementation. In alternate embodiments, the pretreatment operation involves exposing the substrate to $O_2$, $O_2/N_2$, $O_2/He$, $O_2/Ar$ or other pretreatment chemistries, in a non-plasma environment. In these embodiments, the substrate may be exposed to the pretreatment chemistry in the presence energy from another energy source, including a thermal energy source, a ultra-violet source, a microwave source, etc. In certain embodiments, other pretreatment operations described above, a substrate is pretreated with exposure to a catalyst. The pre-treatment operation, if performed, may occur in the deposition chamber or may occur in another chamber prior to transfer of the substrate to the deposition chamber. Once in the deposition chamber, and after the optional pre-treatment operation, process gases are introduced.

Deposition Chemistries

For forming silicon oxides, the process gas reactants generally include a silicon-containing compound and an oxidant, and may also include a catalyst, a solvent and other additives. The gases may also include one or more dopant precursors, e.g., a fluorine, phosphorous and/or boron-containing gas. Sometimes, though not necessarily, an inert carrier gas is present. In certain embodiments, the gases are introduced using a liquid injection system. In certain embodiments, the silicon-containing compound and the oxidant are introduced via separate inlets or are combined just prior to introduction into the reactor in a mixing bowl and/or showerhead. The catalyst and/or optional dopant may be incorporated into one of the reactants, pre-mixed with one of the reactants or introduced as a separate reactant. The substrate is then exposed to the process gases to deposit a flowable film in the gap at an operation 705. Conditions in the reactor are such that the silicon-containing compound and the oxidant react to form a condensed flowable film on the substrate. Formation of the film may be aided by presence of a catalyst. The method is not limited to a particular reaction mechanism, e.g., the reaction mechanism may involve a condensation reaction, a vapor-phase reaction producing a vapor-phase product that condenses, condensation of one or more of the reactants prior to reaction, or a combination of these. The substrate is exposed to the process gases for a period sufficient to deposit a flowable film to fill at least some of the gap or overfill the gap as desired.

In certain embodiments, the silicon-containing precursor is an alkoxysilane. Alkoxysilanes that may be used include, but are not limited to, the following:

$H_x$—Si—$(OR)_y$ where x=0-3, x+y=4 and R is a substituted or unsubstituted alkyl group;

$R'_x$—Si—$(OR)_y$ where x=0-3, x+y=4, R is a substituted or unsubstituted alkyl group and R' is a substituted or unsubstituted alkyl, alkoxy or alkoxyalkane group; and $H_x(RO)_y$—Si—Si—$(OR)_yH_x$ where x=0-2, x+y=0-2 and R is a substituted or unsubstituted alkyl group.

Examples of silicon containing precursors include, but are not limited to, alkoxysilanes, e.g., tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), dimethoxysilane (DMOS), triphenylethoxysilane, 1-(triethoxysilyl)-2-(diethoxymethylsilyl)ethane, tri-t-butoxylsilanol, hexamethoxydisilane (HMODS), hexaethoxydisilane (HEODS), tetraisocyanatesilane (TICS), and bis-tert-butylamino silane (BTBAS). Further examples of silicon containing precursors include silane ($SiH_4$) and alkylsilanes, e.g., methylsilane, and ethylsilane.

In certain embodiments, carbon-doped precursors are used, either in addition to another precursor (e.g., as a dopant) or alone. Carbon-doped precursors include at least one Si—C bond. Carbon-doped precursors that may be used include, but are not limited to the, following:

$R'_x$—$S_1$—$R_y$ where x=0-3, x+y=4, R is a substituted or unsubstituted alkyl group and R' is a substituted or unsubstituted alkyl, alkoxy or alkoxyalkane group; and $SiH_xR'_y$—$R_z$ where x=1-3, y=0-2, x+y+z=4, R is a substituted or unsubstituted alkyl group and R' is a substituted or unsubstituted alkyl, alkoxy or alkoxyalkane group.

Examples of carbon-doped precursors include ($CH_3Si$ $(OCH_2)_3$, trimethylsilane (3MS), tetramethylsilane (4MS), diethoxymethylsilane (DEMS), dimethyldimethoxysilane (DMDMOS), methyl-triethoxysilane (MTES), methyl-trimethoxysilane, methyl-diethoxysilane and methyl-dimethoxysilane. Additional carbon-doped precursors are described above. In certain embodiments, the film is doped with extra silicon.

Examples of suitable oxidants include, but are not limited to, ozone ($O_3$), peroxides including hydrogen peroxide ($H_2O_2$), oxygen ($O_2$), water ($H_2O$), alcohols such as methanol, ethanol, and isopropanol, nitric oxide (NO), nitrous dioxide ($NO_2$) nitrous oxide ($N_2O$), carbon monoxide (CO) and carbon dioxide ($CO_2$). In certain embodiments, a remote plasma generator may supply activated oxidant species.

One or more dopant precursors, catalysts, inhibitors, buffers, solvents and other compounds may be introduced. In certain embodiments, a proton donor catalyst is employed. Examples of proton donor catalysts include 1) acids including nitric, hydrofluoric, phosphoric, sulphuric, hydrochloric and bromic acids; 2) carboxylic acid derivatives including R—COOH and R—C(=O)X where R is substituted or unsubstituted alkyl, aryl, acetyl or phenol and X is a halide, as well as R—COOC—R carboxylic anhydrides; 3) $Si_xX_yH_z$ where x=1-2, y=1-3, z=1-3 and X is a halide; 4) $R_xSi$—$X_y$ where x=1-3 and y=1-3; R is alkyl, aloxy, aloxyalkane, aryl, acetyl or phenol; and X is a halide; and 5) ammonia and derivatives including ammonium hydroxide, hydrazine, hydroxylamine, and R—$NH_2$ where R is substituted or unsubstituted alkyl, aryl, acetyl, or phenol.

In addition to the examples of catalysts given above, halogen-containing compounds which may be used include halogenated organic molecule such as dichlorosilane ($SiCl_{12}H_2$), trichlorosilane ($SiCl_3H$), methylchlorosilane ($SiCH_3C_1H_2$), chlorotriethoxysilane, and chlorotrimethoxysilane. Acids which may be used may be mineral acids such as hydrochloric acid (HCl), sulphuric acid ($H_2SO_4$), and phosphoric acid ($H_3PO_4$); organic acids such as formic acid (HCOOH), acetic acid (CH3COOH), and trifluoroacetic acid ($CF_3COOH$). Bases which may be used include ammonia ($NH_3$) or ammonium hydroxide ($NH_4OH$), phosphine ($PH_3$); and other nitrogen- or phosphorus-containing organic compounds. Additional examples of catalysts are chloro-diethoxysilane, methanesulfonic acid ($CH_3SO_3H$), trifluoromethanesulfonic acid ("triflic", $CF_3SO_3H$), chloro-dimethoxysilane, pyridine, acetyl chloride, chloroacetic acid ($CH_2ClCO_2H$), dichloroacetic acid ($CHCl_2CO_2H$), trichloroacetic acid ($CCL_2CO_2H$), oxalic acid ($HO_2CCO_2H$) and benzoic acid ($C_6H_5CO_2H$).

According to various embodiments, catalysts and other reactants may be introduced simultaneously or in particular sequences. For example, in some embodiments, a acidic compound may be introduced into the reactor to catalyze the hydrolysis reaction at the beginning of the deposition process, then a basic compound may be introduced near the end of the hydrolysis step to inhibit the hydrolysis reaction and the catalyze the condensation reaction. Acids or bases may be introduced by normal delivery or by rapid delivery or "puffing" to catalyze or inhibit hydrolysis or condensation reaction quickly during the deposition process. Adjusting and altering the pH by puffing may occur at any time during the deposition process, and difference process timing and sequence may result in different films with properties desirable for different applications. Some examples of catalysts are given above. Examples of other catalysts include hydrochloric acid (HCl), hydrofluoric acid (HF), acetic acid, trifluoroacetic acid, formic acid, dichlorosilane, trichlorosilane, methyltrichlorosilane, ethyltrichlorosilane, trimethoxychlorosilane, and triethoxychlorosilane. Methods of rapid delivery that may be employed are described in U.S. application Ser. No. 12/566,085, incorporated by reference herein. In certain embodiments, a multistage flowable oxide deposition is performed, in which the presence, identity or amount of catalyst is varied according to if a gap is being filled, or a planar or overburden layer is deposited. For example, features are selectively filled by an uncatalyzed process, and an overburden or blanket layer is deposited using a catalyst.

Solvents may be non-polar or polar and protic or aprotic. The solvent may be matched to the choice of dielectric precursor to improve the miscibility in the oxidant. Non-polar solvents include alkanes and alkenes; polar aprotic solvents include acetones and acetates; and polar protic solvents include alcohols and carboxylic compounds.

Examples of solvents that may be introduced include alcohols, e.g., isopropyl alcohol, ethanol and methanol, or other compounds, such as ethers, carbonyls, nitriles, miscible with the reactants. Solvents are optional and in certain embodiments may be introduced separately or with the oxidant or another process gas. Examples of solvents include, but not limited to, methanol, ethanol, isopropanol, acetone, diethylether, acetonitrile, dimethylformamide, and dimethyl sulfoxide, tetrahydrofuran (THF), dichloromethane, hexane, benzene, toluene, isoheptane and diethylether. The solvent may be introduced prior to the other reactants in certain embodiments, either by puffing or normal delivery. In some embodiments, the solvent may be introduced by puffing it into the reactor to promote hydrolysis, especially in cases where the precursor and the oxidant have low miscibility.

Sometimes, though not necessarily, an inert carrier gas is present. For example, nitrogen, helium, and/or argon, may be introduced into the chamber with one of the compounds described above.

As indicated above, any of the reactants (silicon-containing precursor, oxidant, solvent, catalyst, etc.) either alone or in combination with one or more other reactants, may be introduced prior to the remaining reactants. Also in certain embodiments, one or more reactants may continue to flow into the reaction chamber after the remaining reactant flows have been shut off.

In certain embodiments, reactions conditions are such that the silicon-containing compound and oxidant, undergo a condensation reaction, condensing on the substrate surface to form a flowable film. In certain embodiments, the reaction takes place in dark or non-plasma conditions. In other embodiments, the reaction takes place in the presence of a plasma. Methods of depositing a flowable film for gap fill via a plasma-enhanced chemical vapor deposition (PECVD) reaction are described in U.S. patent application Ser. No. 12/334,726, incorporated by reference herein.

Chamber pressure may be between about 1-200 Torr, in certain embodiments, it is between 10 and 75 Ton. In a particular embodiment, chamber pressure is about 10 Torr.

Partial pressures of the process gas components may be characterized in terms of component vapor pressure and range as follows, with Pp the partial pressure of the reactant and Pvp the vapor pressure of the reactant at the reaction temperature:

Precursor partial pressure ratio($Pp/Pvp$)=0.01-1, e.g., 0.01-0.5

Oxidant partial pressure ratio($Pp/Pvp$)=0.25-2, e.g., 0.5-1

Solvent partial pressure ratio($Pp/Pvp$)=0-1, e.g., 0.1-1

In certain embodiments, the process gas is characterized by having a precursor partial pressure ratio is 0.01 and 0.5, an oxidant partial ratio between 0.5 and 1, and a solvent (if present) partial pressure ratio between 0.1 and 1. In the same or other embodiments, the process gas is characterized by the following:

Oxidant: Precursor partial pressure ratio($Pp_{oxidant}/Pp_{precursor}$)=1-30, e.g., 5-15

Solvent: Oxidant partial pressure ratio($Pp_{solvent}/Pp_{oxidant}$)=0-10, e.g., 0.1-5

In certain embodiments, the process gas is characterized by an oxidant:precursor partial pressure ratio of between about 5 and 15 and a solvent:oxidant partial pressure ratio of between about 0.1 and 5; as well as further characterized by the ratios described above.

Substrate temperature is between about −20° C. and 100° C. in certain embodiments. In certain embodiments, temperature is between about −20° C. and 30° C., e.g., between −10° C. and 10° C. Pressure and temperature may be varied to adjust deposition time; high pressure and low temperature are generally favorable for quick deposition. High temperature and low pressure will result in slower deposition time. Thus, increasing temperature may require increased pressure. In one embodiment, the temperature is about 5° C. and the pressure about 10 Torr. Exposure time depends on reaction conditions as well as the desired film thickness. Deposition rates are from about 100 angstroms/min to 1 micrometer/min according to various embodiments. In certain embodiments, deposition time is 0.1-180 seconds, e.g., 1-90 seconds. In certain embodiments, deposition time is less than nucleation delay for the same deposition process on a blanket film.

The substrate is exposed to the reactants under these conditions for a period long enough to deposit a flowable film in the gap. In the depicted embodiment, the entire desired thickness of film is deposited in operation 705, as it is a single cycle deposition. In other embodiments which employ multiple deposition operations, only a portion of the desired film thickness is deposited in a particular cycle. In certain embodiments, the substrate is continuously exposed to the reactants during operation 705, though in other embodiments, one or more of the reactants may be pulsed or otherwise intermittently introduced. Also as noted above, in certain embodiments, one or more of the reactants including a dielectric precursor, oxidant, catalyst or solvent, may be introduced prior to introduction of the remaining reactants and/or continue flowing into the reactor after the remaining reactant flows are shut off.

Exposure time depends on reaction conditions as well as the desired film thickness. Deposition rates are typically from about 100 angstroms/min to 1 micrometer/min. In certain embodiments, the deposition may be a plasma-enhanced chemical vapor deposition (PECVD) reaction that uses a capacitively-coupled plasma source. PECVD reactions have lower plasma densities than HDP plasmas, e.g., $10^8$ electrons/cm$^3$ and up to $10^{10}$ electrons/cm$^3$.

Post-Deposition Treatments

After deposition, the as-deposited film is treated according to various embodiments (Block 707). According to various embodiments, one or more treatment operations are performed to do one or more of the following: introduction of a dopant, chemical conversion of the as-deposited film, and densification. In certain embodiments, a single treatment may do or more of these. A post-deposition treatment may be performed in situ, i.e., in the deposition chamber, or in another chamber. Densification operations may be plasma-based, purely thermal, or by exposure to radiation such as ultra-violet, infra-read or microwave radiation.

Post-deposition treating of the flowable oxide film, if performed, may be done in situ or ex situ of the deposition chamber. The post-deposition densification treatment operation may involve one or more operations, any or all of which may also result in chemically converting the as-deposited film. In other embodiments, any or all of the densification operations may densify without conversion. In certain embodiments, one conversion operation may be separately performed, or not performed at all. If separately performed, a conversion operation may be performed before or after a densification operation. In one example, a film is converted and partially densified by exposure to a reactive plasma followed by further densification by thermal anneal in an inert environment.

According to various embodiments, the film may be densified by purely thermal anneal, exposure to a plasma, exposure to ultraviolet or microwave radiation or exposure to another energy source. Thermal anneal temperatures may be 300 C or greater (depending on thermal budget). The treatment may be performed in an inert environment (Ar, He, etc.) or in a potentially reactive environment. Oxidizing environments (using $O_2$, $N_2O$, $O_3$, $H_2O$, $H_2O_2$, NO, $NO_2$, CO, $CO_2$ etc.) may be used, though in certain situation nitrogen-containing compounds will be avoided to prevent incorporation of nitrogen in the film. In other embodiments, nitridizing environments (using $N_2$, $N_2O$, $NH_3$, NO, $NO_2$ etc.) are used. In some embodiments, a mix of oxidizing and nitridizing environments are used. Carbon-containing chemistries may be used to incorporate some amount of carbon into the deposited film. According to various embodiments, the composition of the densified film depends on the as-deposited film composition and the treatment chemistry. For example, in certain embodiments, an Si(OH)x as-deposited gel is converted to a SiO network using an oxidizing plasma cure. In other embodiments, a Si(OH)x as-deposited gel is converted to a SiON network.

In certain embodiments, the film is treated by exposure to a plasma, either remote or direct (inductive or capacitive). This may result in a top-down conversion of the flowable film to a densified solid film. The plasma may be inert or reactive. Helium and argon plasma are examples of inert plasmas; oxygen and steam plasmas are examples of oxidizing plasmas (used for example, to remove carbon as desired). Hydrogen plasmas may also be used. Temperatures during plasma exposure are typically about 200° C. or higher. In certain embodiments, an oxygen or oxygen-containing plasma is used to remove carbon.

Temperatures may range from 0-600° C., with the upper end of the temperature range determined by the thermal budget at the particular processing stage. For example, in certain embodiments, the entire process shown in FIG. 3 is carried out at temperatures less than about 400° C. This temperature regime is compatible with NiSi contacts. In certain embodiments, the temperatures range from about 200° C.-550° C. Pressures may be from 0.1-10 Torr, with high oxidant pressures used for removing carbon.

Other annealing processes, including rapid thermal processing (RTP) may also be used to solidify and shrink the film. If using an ex situ process, higher temperatures and other sources of energy may be employed. Ex situ treatments include high temperature anneals (700-1000° C.) in an environment such as $N_2$, $O_2$, $H_2O$ and He. In certain embodiments, an ex situ treatment involves exposing the film to ultra-violet radiation, e.g., in a ultraviolet thermal processing (UVTP) process. For example, temperatures of 400° C. or above in conjunction with UV exposure may be used to cure the film. Other flash curing processes, including RTP, may be used for the ex situ treatment as well.

In certain embodiments, a film is densified and converted by the same process operations. Converting a film involves using a reactive chemistry. According to various embodiments, the composition of the film depends on the as-deposited film composition and the cure chemistry. For example, in certain embodiments, an Si(OH)x as-deposited gel is converted to a SiO network using an oxidizing plasma cure. In other embodiments, a Si(OH)x as-deposited gel is converted to a SiON network by exposure to an oxidizing and nitridizing plasma.

In other embodiments, the flowable dielectric film may be a silicon and nitrogen-containing film, such as silicon nitride or silicon oxynitride. It may be deposited by introducing vapor phase reactants to a deposition chamber at conditions such that they react to form a flowable film. The vapor phase reactants may include species created by a plasma. Such a plasma may be generated remotely or in the deposition chamber. The nitrogen incorporated in the film may come from one or more sources, such as a silicon and nitrogen-containing precursor (for example, trisilylamine (TSA) or disilylamine (DSA)), a nitrogen precursor (for example, ammonia (NH3) or hydrazine (N2H4)), or a nitrogen-containing gas fed into a plasma (N2, NH3, NO, NO2, N2O). After deposition, the flowable dielectric film may be treated to do one or more of the following: chemical conversion of the as-deposited film, densification. The chemical conversion may include removing some or all of the nitrogen component, converting a Si(ON)x film to a primarily SiO network. It may also include removal of one or more of —H, —OH, —CH and —NH species from the film. The post-deposition treatment may include exposure to thermal, plasma, UV, IR or microwave energy.

Reaction Mechanism

As indicated above, the flowable dielectric deposition may involve various reaction mechanisms depending on the specific implementation. Examples of reaction mechanisms in a method of depositing a flowable oxide film according to certain embodiments are described below. It should be noted that while these reaction steps provide a useful framework for describing various aspects of the invention, the methods described herein are not necessarily limited to a particular reaction mechanism.

The overall deposition process may be described in context of two steps: hydrolysis and condensation. The first step involves hydrolysis of silicon-containing precursors by the oxidant. For example, alkoxy groups (—OR) of the silicon containing precursor may be replaced with hydroxyl groups (—OH). The —OH groups and the residual alkoxy groups participate in condensation reactions that lead to the release of water and alcohol molecules and the formation of Si—O—Si linkages. In this mechanism, the as-deposited film does not have appreciable carbon content even though the alkoxysilane precursor contains carbon. In certain embodiments, reactant partial pressure is controlled to facilitate bottom up fill. Liquid condensation occurs below saturation pressure in narrow gaps; the reactant partial pressure controls the capillary condensation. In certain embodiments, reactant partial pressure is set slightly below the saturation pressure. In a hydrolyzing medium, the silicon-containing precursor forms a fluid-like film on the wafer surface that preferentially deposits in trenches due to capillary condensation and surface tension forces, resulting in a bottom-up fill process.

FIGS. 8A-8D provides a simplified schematic diagram of deposition and anneal reaction mechanisms according to one embodiment. It should be noted that the methods described herein are not limited to the particular reactants, products and reaction mechanisms depicted, but may be used with other reactants and reaction mechanisms that produce flowable dielectric films. It will also be understood that deposition and annealing may involve multiple different concurrent or sequential reaction mechanisms.

Figure 8A:
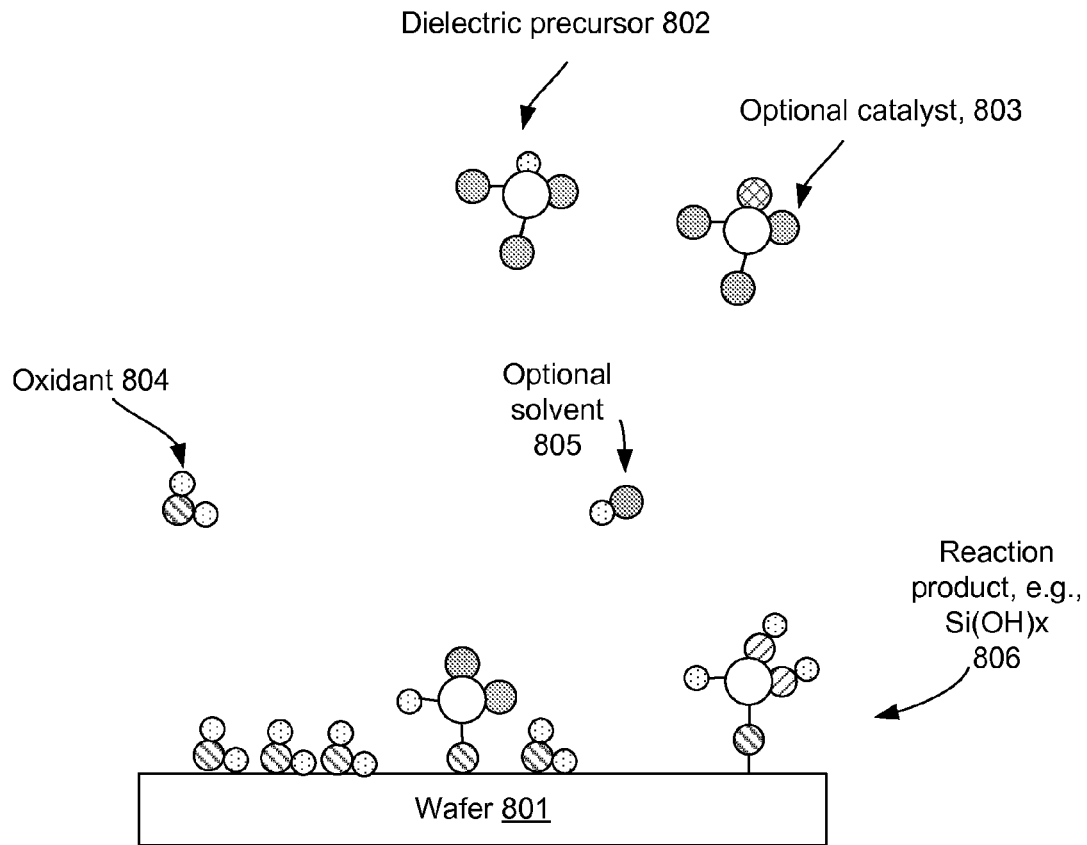
FIGS. 8A-8D are schematic depictions of reaction mechanisms in an example of a method of filling a gap with dielectric material according to certain embodiments.

FIG. 8A depicts reactant condensation, hydrolysis and initiation of the flowable film on a wafer 801, held at a reduced temperature such as −5° C. The reactants include a dielectric precursor 802, an oxidant 804, an optional catalyst 803 and an optional solvent 805. The dielectric precursor absorbs 802 on the surface. A liquid phase reaction between precursor and oxidant results in hydrolysis of precursor, forming silanols Si(OH)x (806) attached to the wafer surface initiating the growth of the film. In certain embodiments, the presence of the solvent improves miscibility and surface wettability.

Figure 8B:
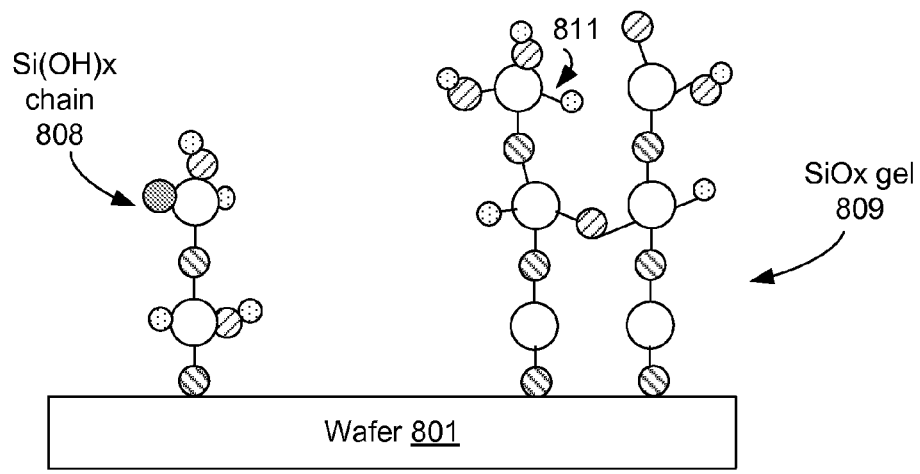
Figure 8C:
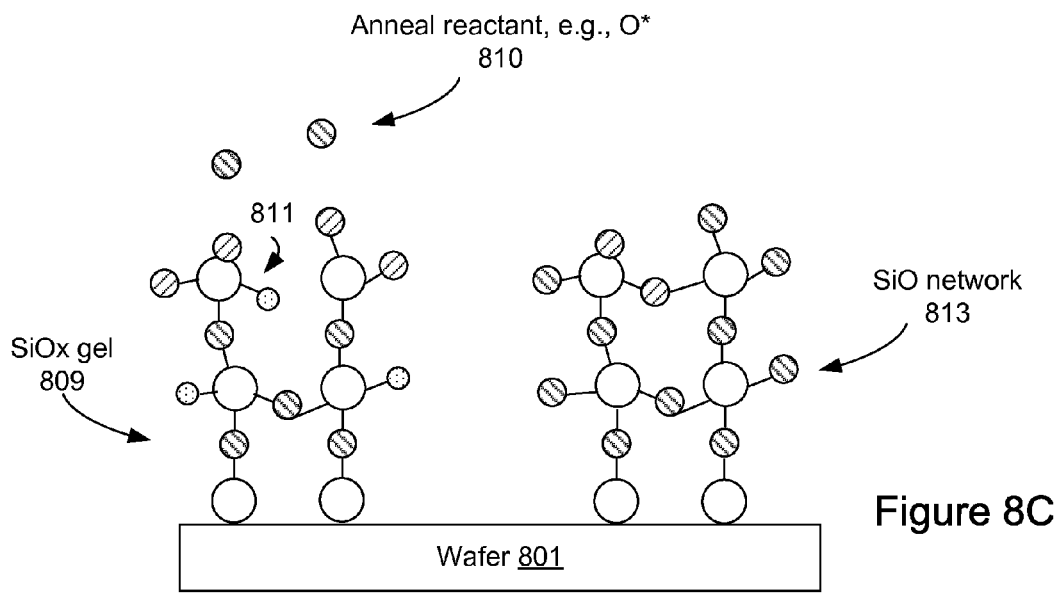
Figure 8D:
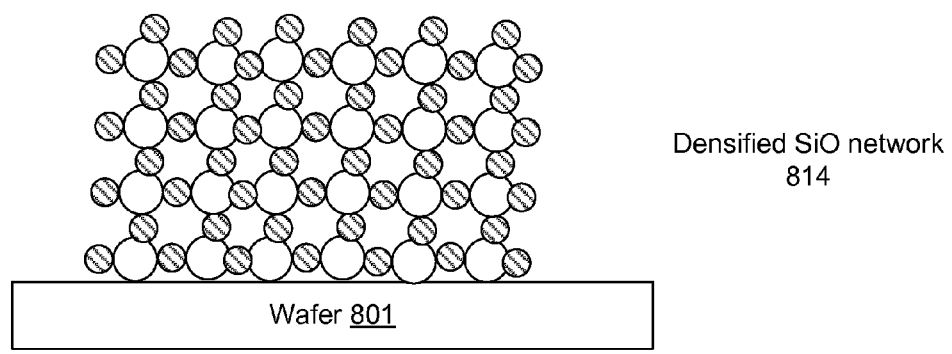

FIG. 8B depicts polymerization of the product (see Si(OH)x chain 808) as well as condensation of the silanols to form crosslinked Si—O chains. The result of the condensation reaction is a gel 809. At this stage, the organic groups may be substantially eliminated from the gel 809, with alcohol and water released as byproducts, though as depicted Si—H groups 811 remain in the gel as do hydroxyl groups. In some cases, a minute but detectable amount of carbon groups remains in the gel. The overall carbon content may be less than 1% (atomic). In some embodiments, essentially no carbon groups remain, such that Si—C groups are undetectable by FTIR. FIG. 8C depicts a reaction mechanism during an anneal, in this case in the presence of an activated oxygen species O* (810), e.g. oxygen radicals, ions, etc. In certain embodiments, the anneal has two effects: 1) oxidation of the gel, to convert SiOH and SiH to SiO and the gel to a SiO network 813; and 2) film densification or shrinkage. The oxygen oxidizes Si—H bonds and facilitates formation of a SiOx network with substantially no Si—H groups. The substrate temperature may be raised, e.g., to 375° C. to facilitate film shrinkage and oxidization. In other embodiments, the oxidation and shrinkage operations are carried out separately. In some embodiments, oxidation may occur at a first temperature (e.g., 300° C.) with further densification occurring at a higher temperature (e.g., 375° C.). FIG. 8D shows a schematic depiction of a densified SiO film 814.

Fill Height Selectivity

Figure 9A:
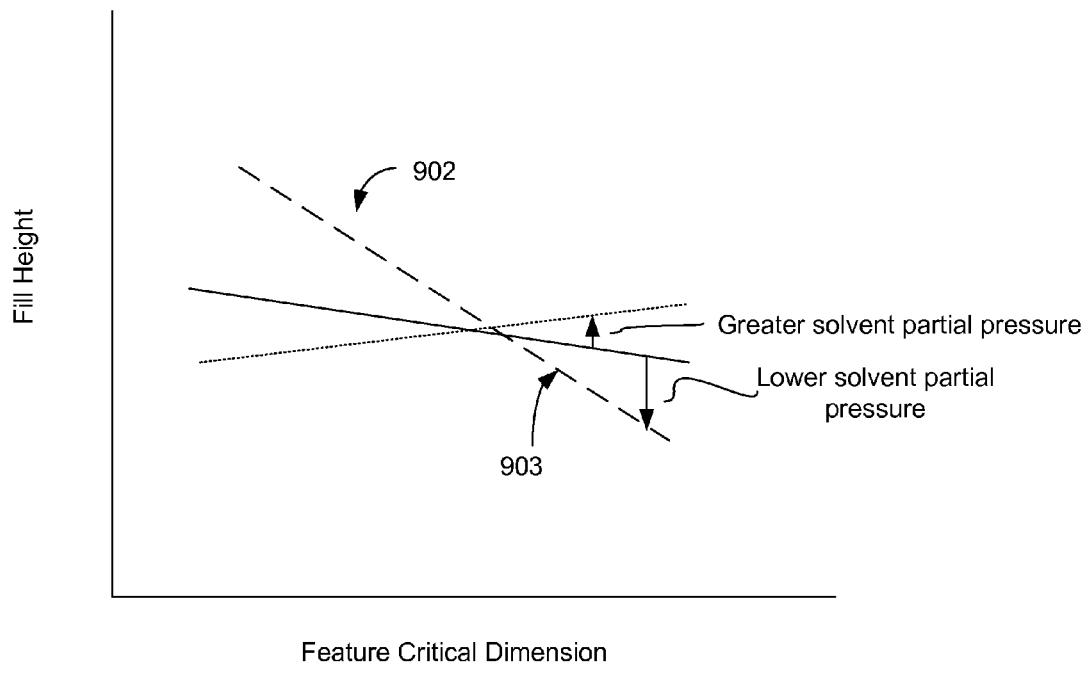
FIG. 9A is a graph qualitatively illustrating the tunability of feature fill selectivity.

Flowable oxide fill height is a function of critical dimension. That is, deposition into wide features results in little to no fill height with height increasing as the feature dimension narrows. It has been found that in certain embodiments, the slope of the fill height vs. critical dimension curve is tunable by tuning reactant partial pressures. FIG. 9A presents qualitative examples in which curve 902 is obtained by lowering the solvent partial pressure and curve 903 is obtained by raising the solvent partial pressure. In this manner, the fill selectivity across features of various critical dimensions can be tuned for a particular deposition, for example, to increase fill height in narrow features and decrease it in wide features.

Figure 9B:
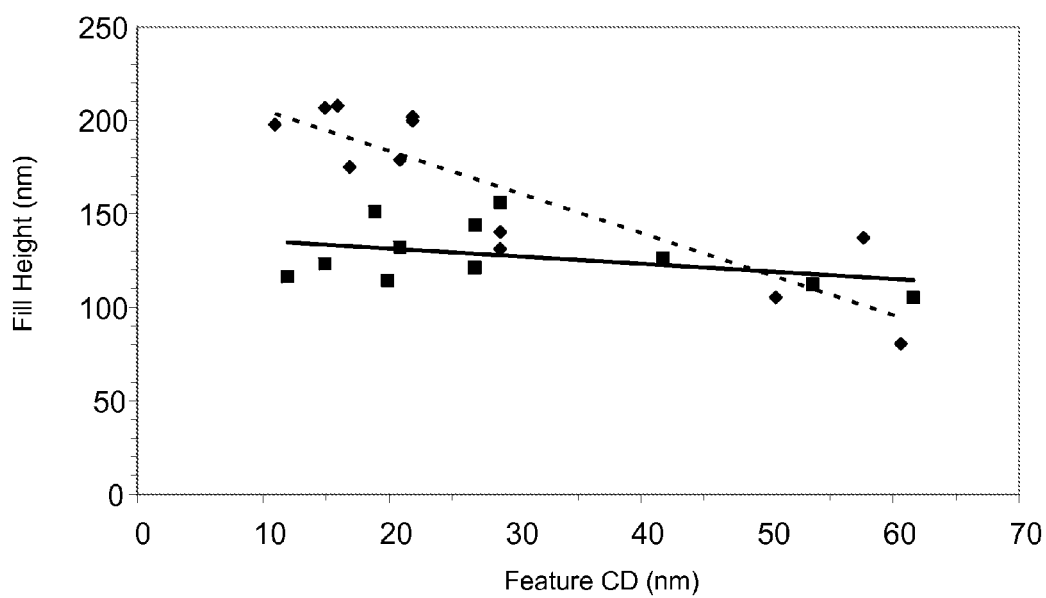
FIG. 9B is a plot illustrating the dependence of fill height for a particular feature size on solvent partial pressure.

FIG. 9B is a graph showing two data series: the data points represented by a square are from a process having a higher solvent (ethanol) partial pressure; the data points represented by a diamond using the same process but with lower solvent (ethanol) partial pressure. As can be seen lower solvent partial pressure changes the slope of the curve such that fill selectivity of narrower features is increased. Without being bound by a particular theory, it is believed that the tunability of fill height selectivity is a feature of depositions involving capillary condensation mechanisms. The amount of solvent, for example, has a large effect on the surface tension of the fill already in the feature, and hence the capillary condensation mechanism. Ranges of reactant partial pressure ratios are provided above. Capillary condensation mechanisms according to certain embodiments are described above and in U.S. Pat. No. 7,074,690, incorporated by reference above.

Process Sequences

Figure 10:
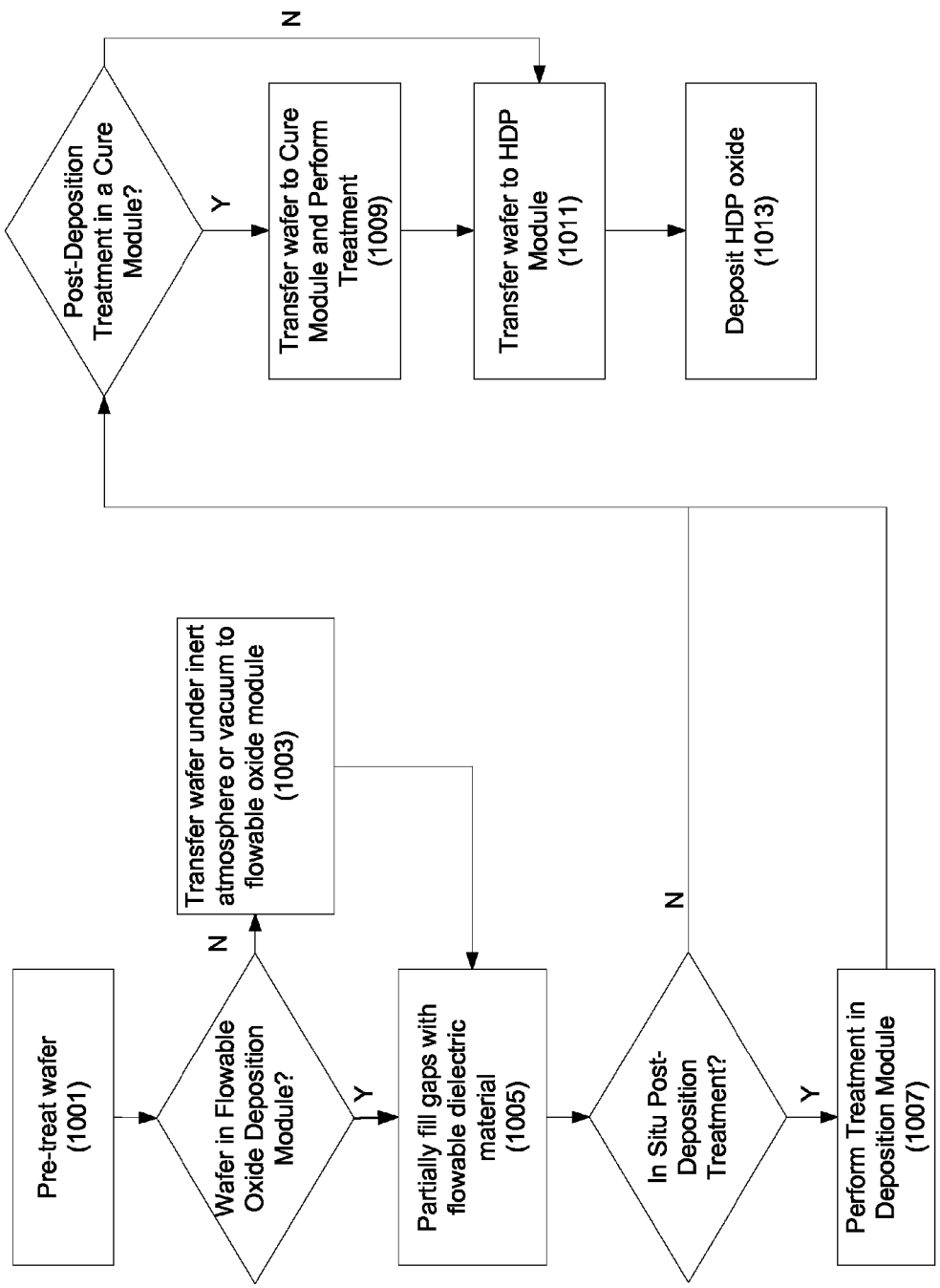
FIG. 10 is a process flow diagram illustrating operations in a method of depositing flowable dielectric material in gaps according to certain embodiments.
Figure 11:
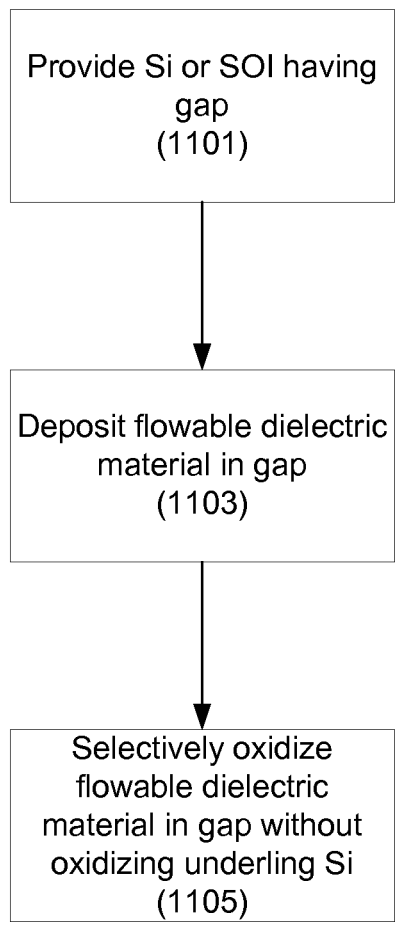
FIG. 11 is a process flow diagram illustrating operations in a method of depositing flowable oxide in a gap in a silicon or SOI substrate according to certain embodiments.
Figure 12:
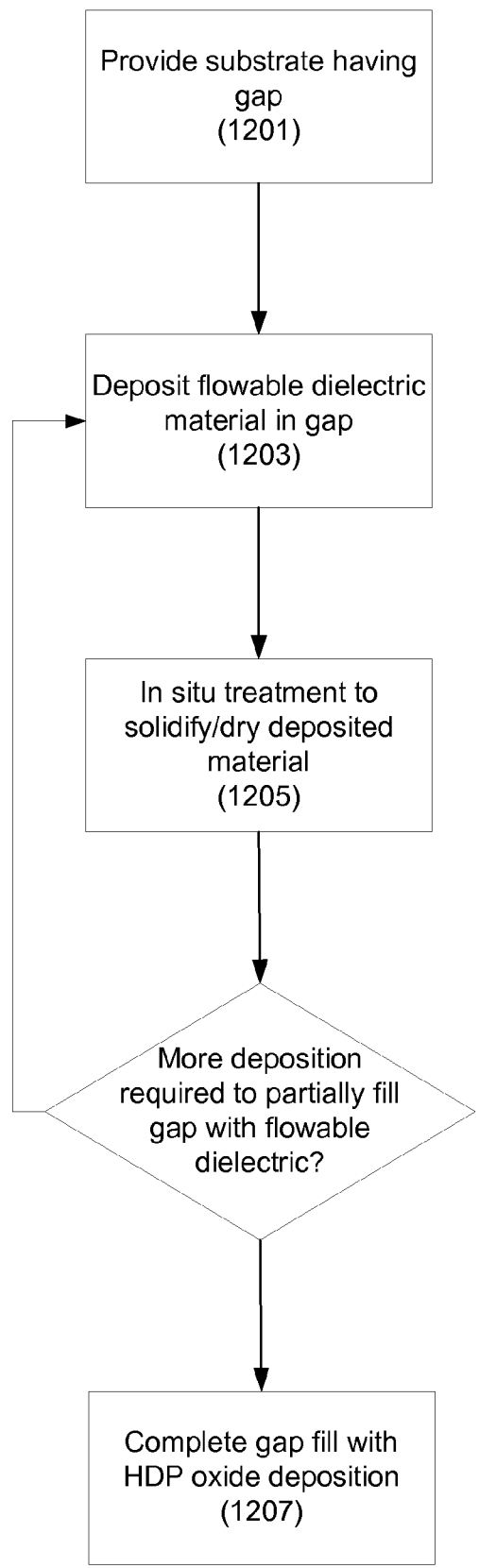
FIG. 12 is a process flow diagram illustrating operations in method of filling a gap with dielectric material according to certain embodiments.

FIGS. 10-12 provide examples of process sequences according to various embodiments. First, in FIG. 10, a process begins by pre-treating a wafer, e.g., to make it hydrophilic or otherwise treated for deposition. (Block 1001). Examples of pre-treatments are described above. In some embodiments, this operation may not be performed, that is the wafer may be provided directly to a flowable oxide deposition module for deposition. As indicated in FIG. 10, if the pre-treatment is performed outside the flowable oxide deposition module, the wafer is then transferred to the flowable oxide deposition module (1003). This typically occurs under inert atmosphere or vacuum to preserve the effects of the pre-treatment. One or more gaps are then partially filled with a flowable oxide film. (Block 1005). According to various embodiments, this may involve a single deposition, or multiple deposition cycles. If an in situ post-deposition treatment is to be performed, it is done in the deposition module (Block 1007). After the in situ post-deposition treatment is performed, or directly after deposition if no in situ treatment is performed, the wafer is transferred to a separate cure module and treated if a separate treatment is to be performed (Block 1009). For example, in certain embodiments, the wafer is transferred to a remote cure module for exposure to a remotely generated oxidizing plasma. The wafer is then transferred to an HDP deposition module for HDP deposition. (Block 1011). HDP oxide is then deposited. (Block 1013). Although not indicated, exposure to a direct inductively couple oxidizing plasma or other treatment may occur in the HDP module prior to deposition of HDP oxide in some embodiments. In some embodiments, the flowable film is oxidized during HDP oxide deposition.

Various modifications may be made in the process shown in FIG. 10. For example, in certain embodiments, pre-treatment and/or flowable oxide deposition may take place in the HDP deposition module, eliminating certain transfer operations. It should be noted that prior to operation 1001, the gaps on the wafer may be unfilled (e.g., as depicted in FIG. 1A) or may be partially filled from one or more preceding flowable oxide or HDP depositions as described above.

Once in the HDP chamber, the wafer may be subjected to a pre-heat operation. According to various embodiments, the pre-heat may be accompanied by exposure to an oxidant to oxidize the flowable film prior to HDP oxide deposition. In other embodiments, the pre-heat is performed in an oxidant-free environment. The latter may be done, e.g., after treatment in a remote plasma cure module.

FIG. 11 is a process sequence according to certain embodiments in which the flowable dielectric material is deposited in a gap formed in a silicon or SOI surface. An example is gap fill in an STI integration process. The process described in FIG. 11 may be used in conjunction with that described in FIG. 10, for example. First, a silicon or SOI wafer including a gap formed in the silicon or SOI is provided. (Block 1101). Flowable dielectric material is then deposited in the gap. (Block 1103). Various pre-treatments as described above may be performed prior to deposition. The flowable dielectric material is then selectively oxidized, i.e., it is oxidized without oxidizing the underlying silicon. (Block 1105).

Selectively oxidizing the flowable dielectric material may involve exposure to a remotely generated oxidizing plasma, exposure to ultraviolet radiation in the presence of steam or another oxidant, or exposure to an oxidant in a thermal anneal, e.g., a steam anneal. As described above, these may be performed in the deposition chamber or in another chamber.

In certain embodiments, a direct (non-remote) inductively-coupled or capacitively-coupled oxidizing plasma is used to selectively oxidize the flowable dielectric material. In such instances, selective oxidation may involve not applying a bias to the substrate and/or performing the oxidation at relatively low temperatures. In one example, the plasma is applied at the deposition temperature in situ in the chamber. Lowering plasma density may also improve selectivity. Also in certain embodiments, pre-heat in an HDP chamber is done in a non-oxidant environment to prevent oxidation of the underlying layer.

As mentioned above, in certain embodiments deposition of the flowable dielectric film involves multiple deposition-cure cycles. FIG. 12 illustrates a process sequence involving such an operation. First, a substrate including a gap is provided. (Block 1201). Then, an amount of flowable oxide film is deposited in the gap. (Block 1203). In certain embodiments, the amount of flowable oxide deposited in operation 1203 is less than the total desired amount of flowable oxide desired in the gap. The deposited flowable dielectric material is then treated to wholly or partially solidify the material deposited in the previous operation. (Block 1205). Here, the treatment that is performed does not appreciably shrink the film, but dries or solidifies it such that it provides structural reinforcement to the sidewalls of the gap. Solidification or drying without substantial shrinkage may be accomplished in certain embodiments by an in-situ inert or reactive plasma at the deposition temperature or non-plasma exposure to an oxidant. While there may be some amount of cross-linking and densification, this operation is distinct from a full densification and cross-linking In certain embodiments, the treatment also functions as a pre-treatment for a subsequent deposition operation. In one example, the film is exposed to a nitrogen and oxygen-containing plasma at the deposition temperature. In other embodiments, the solidification operation may be succeeded by a pre-treatment operation prior to additional flowable oxide deposition. For example, this may involve exposure to an inert plasma followed by exposure to an oxidizing pre-treatment plasma. The flowable oxide deposition and treatment operations are repeated until the desired amount of flowable oxide is deposited. In the depicted embodiment, this is enough only to partially fill the gap, though in other embodiments, it may be to fully fill the gap. In the depicted embodiment, gap fill is then completed with HDP oxide deposition. (Block 1207). Densification or other treatments may be performed prior to the HDP oxide deposition.

Apparatus

The methods of the present invention may be performed on a wide-range of apparatuses. The deposition operations may be implemented on any chamber equipped for deposition of dielectric film, including HDP-CVD reactors, PECVD reactors, sub-atmospheric CVD reactor, any chamber equipped for CVD reactions, and chambers used for PDL (pulsed deposition layers), with the treatment operations performed using these or other chambers.

Generally, an apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). While in process, each wafer is held in place by a pedestal, wafer chuck and/or other wafer holding apparatus. For certain operations in which the wafer is to be heated, the apparatus may include a heater such as a heating plate.

Figure 13:
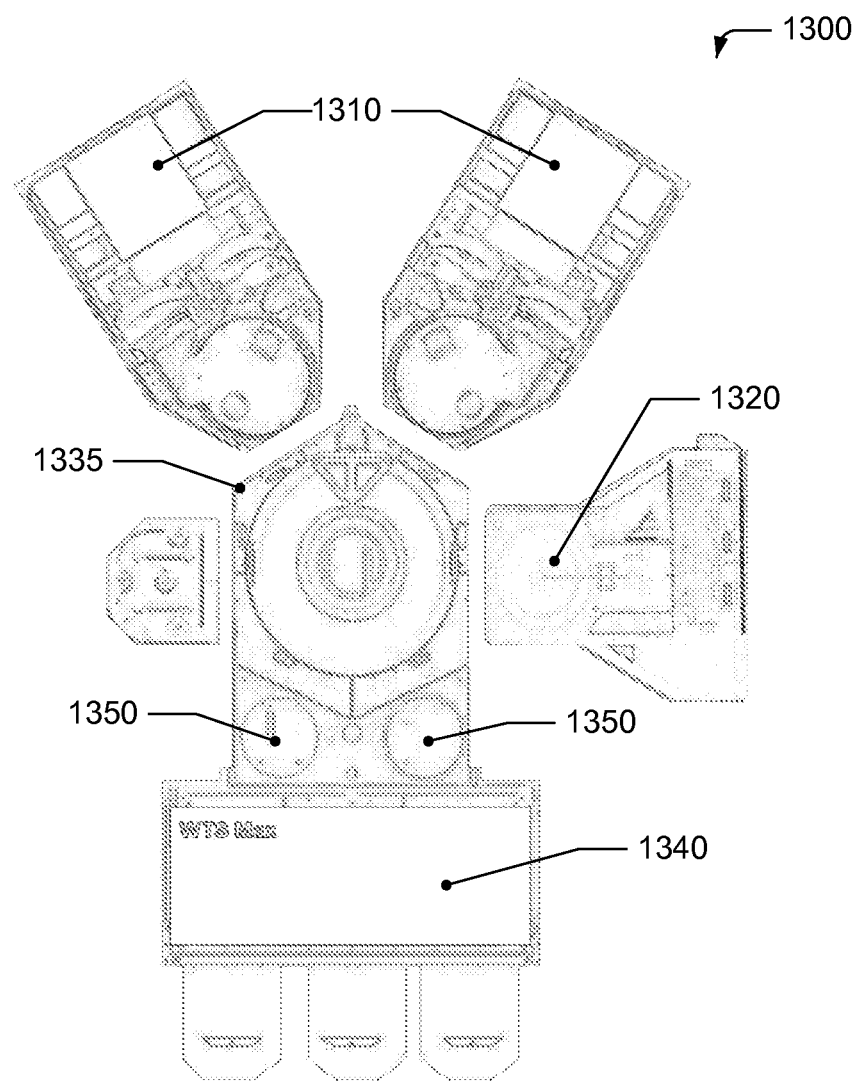
FIG. 13 is a top view diagram illustrating a multi-station apparatus suitable for practicing selected embodiments.

FIG. 13 depicts example tool configuration 1300 in which the tool includes two high density plasma chemical vapor deposition (HDP-CVD) modules 1310, flowable gap fill module 1320, WTS (Wafer Transfer System) 1340, loadlocks 1350, in some embodiments including a wafer cooling station, and vacuum transfer module 1335. HDP-CVD modules 1310 may, for example, be Novellus SPEED MAX modules. Flowable gap fill module 1320 may, for example, be a Novellus Flowable Oxide module.

Figure 14:
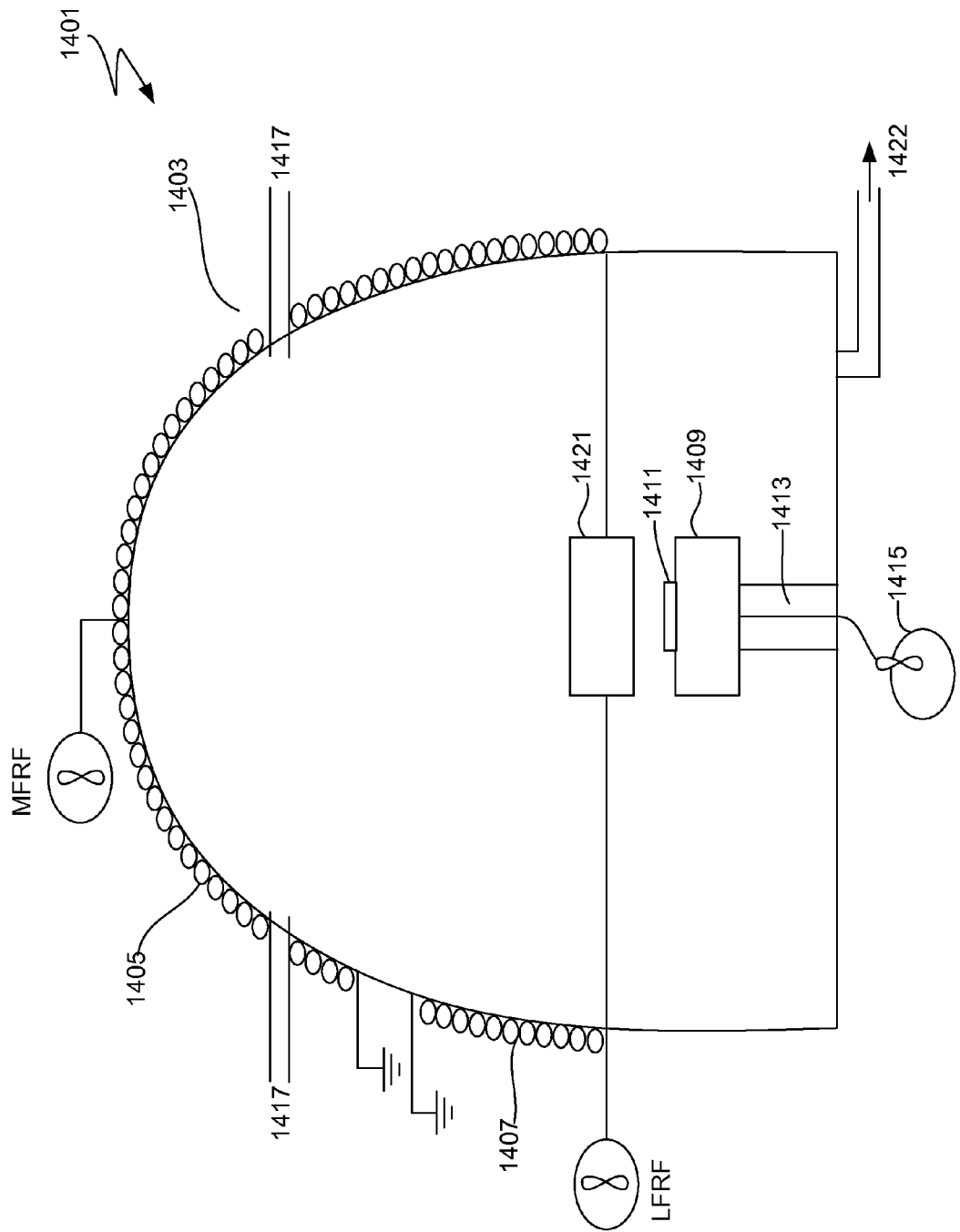
FIG. 14 is simplified illustration of a HDP-CVD module suitable for practicing various embodiments.

FIG. 14 is a simplified illustration of various components of a HDP-CVD apparatus that may be used for deposition of HDP oxide and pre- and/or post-deposition treatment or cures according to various embodiments. Also in certain embodiments, it may be used for flowable oxide deposition. As shown, a reactor 1401 includes a process chamber 1403 which encloses other components of the reactor and serves to contain the plasma. In one example, the process chamber walls are made from aluminum, aluminum oxide, and/or other suitable material. The embodiment shown in FIG. 14 has two plasma sources: top RF coil 1405 and side RF coil 1407. Top RF coil 1405 is a medium frequency or MFRF coil and side RF coil 1407 is a low frequency or LFRF coil. In the embodiment shown in FIG. 14, MFRF frequency may be from 430-470 kHz and LFRF frequency from 340-370 kHz. However, apparatuses having single sources and/or non-RF plasma sources may be used.

Within the reactor, a wafer pedestal 1409 supports a substrate 1411. A heat transfer subsystem including a line 1413 for supplying heat transfer fluid controls the temperature of substrate 1411. The wafer chuck and heat transfer fluid system can facilitate maintaining the appropriate wafer temperatures.

A high frequency RF of HFRF source 1415 serves to electrically bias substrate 1411 and draw charged precursor species onto the substrate for the pre-treatment or cure operation. Electrical energy from source 1415 is coupled to substrate 1411 via an electrode or capacitive coupling, for example. Note that the bias applied to the substrate need not be an RF bias. Other frequencies and DC bias may be used as well.

The process gases are introduced via one or more inlets 1417. The gases may be premixed or not. The gas or gas mixtures may be introduced from a primary gas ring 1421, which may or may not direct the gases toward the substrate surface. Injectors may be connected to the primary gas ring 1421 to direct at least some of the gases or gas mixtures into the chamber and toward substrate. The injectors, gas rings or other mechanisms for directing process gas toward the wafer are not present in certain embodiments. Process gases exit chamber 1403 via an outlet 1422. A vacuum pump typically draws process gases out and maintains a suitably low pressure within the reactor. While the HDP chamber is described in the context of pre- and/or post-deposition treatment or cure, in certain embodiments, it may be used as a deposition reactor for deposition of a flowable film. For example, in a thermal (non-plasma) deposition, such a chamber may be used without striking a plasma.

Figure 15:
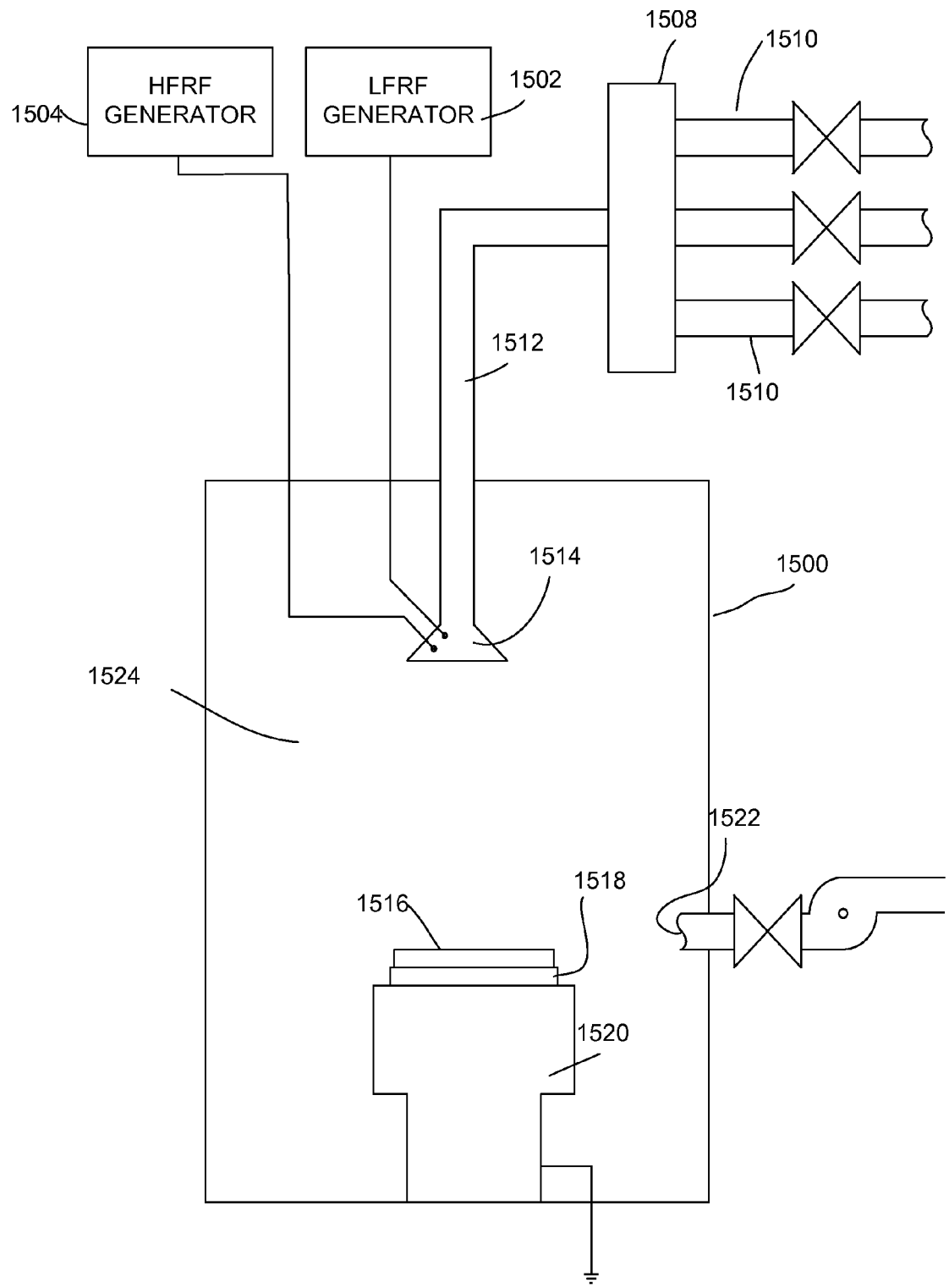
FIG. 15 is a simplified illustration of a direct plasma deposition/cure module suitable for practicing various embodiments.

FIG. 15 shows an example of a reactor that may be used in accordance with certain embodiments of the invention. The reactor shown in FIG. 15 is suitable for both the dark (non-plasma) or plasma-enhanced deposition as well as cure, for example, by capacitively-coupled plasma anneal. As shown, a reactor 1500 includes a process chamber 1524, which encloses other components of the reactor and serves to contain the plasma generated by a capacitor type system including a showerhead 1514 working in conjunction with a grounded heater block 1520. A low-frequency RF generator 1502 and a high-frequency RF generator 1504 are connected to showerhead 1514. The power and frequency are sufficient to generate a plasma from the process gas, for example 400-700 W total energy. In the implementation of the present invention, the generators are not used during dark deposition of the flowable film. During the plasma anneal step, one or both generators may be used. For example, in a typical process, the high frequency RF component is generally between 2-60 MHz; in a preferred embodiment, the component is 13.56 MHz.

Within the reactor, a wafer pedestal 1518 supports a substrate 1516. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 1512. Multiple source gas lines 1510 are connected to manifold 1508. The gases may be premixed or not. The temperature of the mixing bowl/manifold lines should be maintained at levels above the reaction temperature. Temperatures at or above about 8° C. at pressures at or less than about 20 Torr usually suffice. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 1524 via an outlet 1522. A vacuum pump 1526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Figure 16:
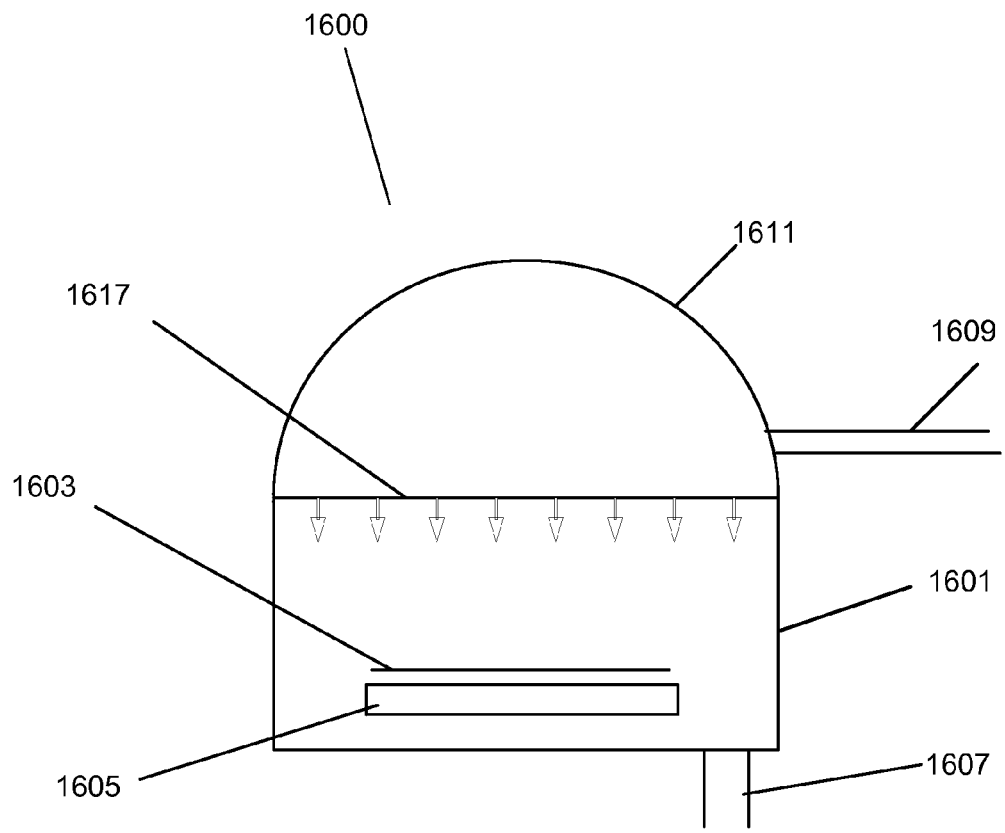
FIG. 16 is a simplified illustration of a remote plasma deposition/cure module suitable for practicing various embodiments.

FIG. 16 illustrates a simplified schematic of a remote plasma pre-treatment and/or cure module according to certain embodiments. Apparatus 1600 has a plasma producing portion 1611 and an exposure chamber 1601 separated by a showerhead assembly or faceplate 1617. Inside exposure chamber 1601, a platen (or stage) 1605 provides a wafer support. Platen 1605 is fitted with a heating/cooling element. In some embodiments, platen 1605 is also configured for applying a bias to wafer 1603. Low pressure is attained in exposure chamber 1601 via vacuum pump via conduit 1607. Sources of gaseous treatment gases provide a flow of gas via inlet 1609 into plasma producing portion 1611 of the apparatus. Plasma producing portion 1611 may surrounded by induction coils (not shown). During operation, gas mixtures are introduced into plasma producing portion 1611, the induction coils are energized and a plasma is generated in plasma producing portion 1611. Showerhead assembly 1617 may have an applied voltage and terminates the flow of some ions and allows the flow of neutral species into exposure chamber 1601.

Etching

As indicated, embodiments of the invention include non-selective and selective removal (etch) operations. According to various embodiments, non-selective etching of the HDP oxide and flowable oxide involves exposing the dielectric layer to a plasma containing fluorine species. These species may originate from a fluorine-containing process gas component such as $SiF_4$, $SiH_2F_2$, $Si_2F_6$, $C_2F_6$, $NF_3$, $CF_4$, and the like.

Selective etching of the flowable oxide material may also involve exposing the dielectric layer to a plasma containing fluorine species. In other embodiments, it may be accomplished via a wet etch, e.g., a HF wet etch.

In certain embodiments, one or more of the etch operations involve a downstream etch process, in which the substrate is not directly exposed to a plasma. A remote plasma generator may be used to generate the plasma. In other embodiments, a sputter etch using a non-fluorine chemistry is used. The sputter etch chemistry may include one or more of He, Ar, $O_2$ or $H_2$. In certain embodiments, one or more of these gases are fed to a remote or in situ plasma generator. The etch processes may be performed in the same or different chambers as the preceding deposition process.

FIGS. 13-16 provide examples of apparatuses that may be used to implement the pre-treatments described herein. However, one of skill in the art will understand that various modifications may be made from the description.

In certain embodiments, a system controller is employed to control process parameters. The system controller typically includes one or more memory devices and one or more processors. The processor may include a CPU or computer, analog and/or digital input/output connections, stepper motor controller boards, etc. Typically there will be a user interface associated with system controller. The user interface may include a display screen, graphical software displays of the apparatus and/or process conditions, and user input devices such as pointing devices, keyboards, touch screens, microphones, etc. The system controller may be connected to any or all of the components shown in FIG. 13 of a tool; its placement and connectivity may vary based on the particular implementation.

In certain embodiments, the system controller controls the pressure in the processing chambers. The system controller may also control concentration of various process gases in the chamber by regulating valves, liquid delivery controllers and MFCs in the delivery system as well as flow restriction valves an the exhaust line. The system controller executes system control software including sets of instructions for controlling the timing, flow rates of gases and liquids, chamber pressure, substrate temperature, and other parameters of a particular process. Other computer programs stored on memory devices associated with the controller may be employed in some embodiments. In certain embodiments, the system controller controls the transfer of a substrate into and out of various components of the apparatuses shown in FIG. 13.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, process gas flow rates, RF power, as well as others described above. These parameters are provided to the user in the form of a recipe, and may be entered utilizing the user interface. Signals for monitoring the process may be provided by analog and/or digital input connections of the system controller. The signals for controlling the process are output on the analog and digital output connections of the apparatus.

The above-described processes and apparatuses may deposit dielectric on any type of substrate that requires thin dielectric layers. Often, the substrate will be a semiconductor wafer having gaps in need of dielectric filling. The invention is not, however, limited to such applications. It may be employed in a myriad of other fabrication processes such as for fabricating flat panel displays.

As indicated above, this invention may be used in integrated circuit fabrication. The gap filling processes are performed on partially fabricated integrated circuits employing semiconductor substrates. In specific examples, the gap filling processes of this invention are employed to form shallow trench isolation (STI), inter-metal layer dielectric (ILD) layers, passivation layers, etc. In certain embodiments, the methods described herein may be applied to integration processes using flowable oxide deposition and any solid dielectric deposition technique, including atomic layer deposition (ALD) and pulsed deposition layer (PDL) techniques. The disclosed methods and apparatuses may also be implemented in systems including lithography and/or patterning hardware for semiconductor fabrication. Further, the disclosed methods may be implemented in a process with lithography and/or patterning processes preceding or following the disclosed methods.

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

The invention claimed is:

1. A method of filling an unfilled gap on a semiconductor substrate, the method comprising:
    depositing a flowable dielectric film in the gap to partially fill the gap;
    after partially filling the gap with the flowable dielectric film, depositing a high density plasma chemical vapor deposition (HDP-CVD) dielectric film via a high density plasma chemical vapor deposition reaction in the gap to complete fill of the gap, wherein the flowable dielectric film is uncured prior to the subsequent HDP-CVD deposition, wherein the flowable dielectric film is at least partially densified during deposition of the HDP-CVD dielectric film, wherein depositing a flowable dielectric film in the gap comprises introducing a process gas comprising a silicon-containing precursor, an oxidant and a solvent, wherein the process gas is characterized as having an oxidant: silicon-containing precursor partial pressure ratio of about 5 to 15.

2. The method of claim 1, wherein the flowable dielectric film is a silicon oxide film, a silicon nitride film or a silicon oxynitride film.

3. A method of filling an unfilled gap on a semiconductor substrate, the method comprising:
    depositing a flowable dielectric film in the gap to partially fill the gap;
    after partially filling the gap with the flowable dielectric film, depositing a high density plasma chemical vapor deposition (HDP-CVD) dielectric film via a high density plasma chemical vapor deposition reaction in the gap to complete fill of the gap, wherein the flowable dielectric film is uncured prior to the subsequent HDP-CVD deposition, wherein the flowable dielectric film is at least partially densified during deposition of the HDP-CVD dielectric film, wherein depositing a flowable dielectric film in the gap comprises introducing a process gas comprising a silicon-containing precursor, an oxidant and a solvent, wherein the process gas is characterized as having a solvent:oxidant partial pressure ratio of about 0.1-5.

4. The method of claim 1, wherein flowable dielectric film is at least partially oxidized during deposition of the HDP-CVD dielectric film.

5. A method of filling an unfilled gap on a substrate, the method comprising:

introducing a process gas comprising a silicon-containing precursor, an oxidant and an optional solvent to thereby deposit a flowable film in the gap to partially fill the gap, wherein the process gas is characterized by the following partial pressure (Pp):vapor pressure (Pvp) ratios:
silicon-containing precursor: 0.01-1;
oxidant: 0.25-2; and
if present, solvent: 0.1-1;

after partially filling the gap with the flowable oxide film, depositing a high density plasma (HDP) dielectric film to complete fill of the gap.

6. The method of claim 5, wherein the Pp:Pvp ratio of the silicon-containing precursor is between 0.01 and 0.5.

7. The method of claim 5, wherein the Pp:Pvp ratio of the oxidant is between 0.5 and 1.

8. The method of claim 5, wherein the Pp:Pvp ratio of the oxidant is between 0.1 and 1.

9. The method of claim 5, wherein the process gas is further characterized as having an oxidant:silicon-containing precursor partial pressure ratio of about 5 to 15.

10. The method of claim 5, wherein the process gas is further characterized as having a solvent:oxidant partial pressure ratio of about 0.1-5.

11. The method of claim 1, further comprising oxidizing the flowable dielectric film in the gap.

12. The method of claim 3, further comprising oxidizing the flowable dielectric film in the gap.

13. The method of claim 3, wherein the flowable dielectric film is a silicon oxide film, a silicon nitride film or a silicon oxynitride film.

14. The method of claim 5, further comprising transferring the substrate from a deposition module to a high density plasma chemical vapor deposition (HDP-CVD) module.

15. The method of claim 5, further comprising partially densifying the flowable dielectric film.

16. The method of claim 6, wherein partially densifying the flowable dielectric film comprises exposing the film to a remote or direct plasma.

17. The method of claim 7, wherein the plasma is an oxidizing plasma.

18. The method of claim 7, wherein the plasma is an oxidizing plasma.

19. The method of claim 5, wherein the flowable film is a silicon oxide film, a silicon nitride film or a silicon oxynitride film.

20. The method of claim 5, wherein the flowable film is a nitrogen-containing film.

21. The method of claim 5, further comprising oxidizing the flowable film in the gap.

22. The method of claim 21, wherein oxidizing the flowable film comprises one of: exposing the film to an oxidant in the presence of ultraviolet light and exposing the film to a remotely-generated oxidizing plasma.

23. The method of claim 21, wherein oxidizing the flowable dielectric film comprises exposing the film to a direct (in situ) plasma.

* * * * *

UNITED STATES PATENT AND TRADEMARK OFFICE
CERTIFICATE OF CORRECTION

PATENT NO.       : 8,728,958 B2
APPLICATION NO.  : 12/964110
DATED            : May 20, 2014
INVENTOR(S)      : Kaihan Ashtiani et al.

Page 1 of 1

It is certified that error appears in the above-identified patent and that said Letters Patent is hereby corrected as shown below:

CLAIMS:

In claim 5, column 27, line 20, change "after partially filling the gap with the flowable oxide film," to --after partially filling the gap with the flowable film,--.

Signed and Sealed this
Sixteenth Day of February, 2016

Michelle K. Lee
*Director of the United States Patent and Trademark Office*